(12) United States Patent
Sung et al.

(10) Patent No.: US 11,101,340 B2
(45) Date of Patent: Aug. 24, 2021

(54) DISPLAY PANEL INCLUDING CONDUCTIVE MEMBER HAVING OPENING

(71) Applicant: Samsung Display Co., Ltd., Yongin-Si (KR)

(72) Inventors: Seungwoo Sung, Yongin-si (KR); Hyungjun Park, Yongin-si (KR); Junyong An, Yongin-si (KR); Nuree Um, Yongin-si (KR); Youngsoo Yoon, Yongin-si (KR); Ilgoo Youn, Yongin-si (KR); Jieun Lee, Yongin-si (KR); Yunkyeong In, Yongin-si (KR); Seunghan Jo, Yongin-si (KR); Junyoung Jo, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/514,941

(22) Filed: Jul. 17, 2019

(65) Prior Publication Data

US 2020/0176539 A1 Jun. 4, 2020

(30) Foreign Application Priority Data

Dec. 4, 2018 (KR) .......................... 10-2018-0154782

(51) Int. Cl.
*H01L 27/32* (2006.01)

(52) U.S. Cl.
CPC .. *H01L 27/3276* (2013.01); *H01L 2251/5392* (2013.01)

(58) Field of Classification Search
CPC ................................................ H01L 27/3276
See application file for complete search history.

(56) References Cited

U.S. PATENT DOCUMENTS

| | | | |
|---|---|---|---|
| 8,890,181 | B2 | 11/2014 | Wang et al. |
| 10,193,102 | B2 | 1/2019 | Kanaya |
| 2011/0080549 | A1 | 4/2011 | Jung et al. |
| 2016/0363909 | A1 | 12/2016 | Kang et al. |
| 2017/0150618 | A1 | 5/2017 | Choi et al. |
| 2017/0288003 | A1 | 10/2017 | Kim et al. |
| 2017/0288004 | A1 | 10/2017 | Kim et al. |

(Continued)

FOREIGN PATENT DOCUMENTS

| | | |
|---|---|---|
| EP | 3174039 A1 | 5/2017 |
| EP | 3176771 A2 | 6/2017 |
| JP | 2018-087863 A | 6/2018 |

(Continued)

*Primary Examiner* — Suberr L Chi
(74) *Attorney, Agent, or Firm* — Innovation Counsel LLP

(57) ABSTRACT

A display panel may include a first hole, a second hole, a display element, a switching element, a wire, and a conductive member. The second hole may be spaced from the first hole. The switching element may be electrically connected to the display element. The wire may bypass the first hole in a plan view of the display panel and may be electrically connected to the switching element. The conductive member may surround each of the first hole and the second hole in the plan view of the display panel, may have an opening between the first hole and the second hole in the plan view of the display panel, and may partially cover the wire. An edge portion of the conductive member may intersect the wire and may be positioned between the display element and the first hole in the plan view of the display panel.

20 Claims, 22 Drawing Sheets

(56) References Cited

U.S. PATENT DOCUMENTS

2018/0151663 A1    5/2018  Kim et al.
2019/0319212 A1*  10/2019  Park .................... H01L 27/3276

FOREIGN PATENT DOCUMENTS

| KR | 10-2017-0059527 A | 5/2017 |
| KR | 10-1844529 B1 | 4/2018 |
| KR | 10-2018-0049296 A | 5/2018 |

* cited by examiner

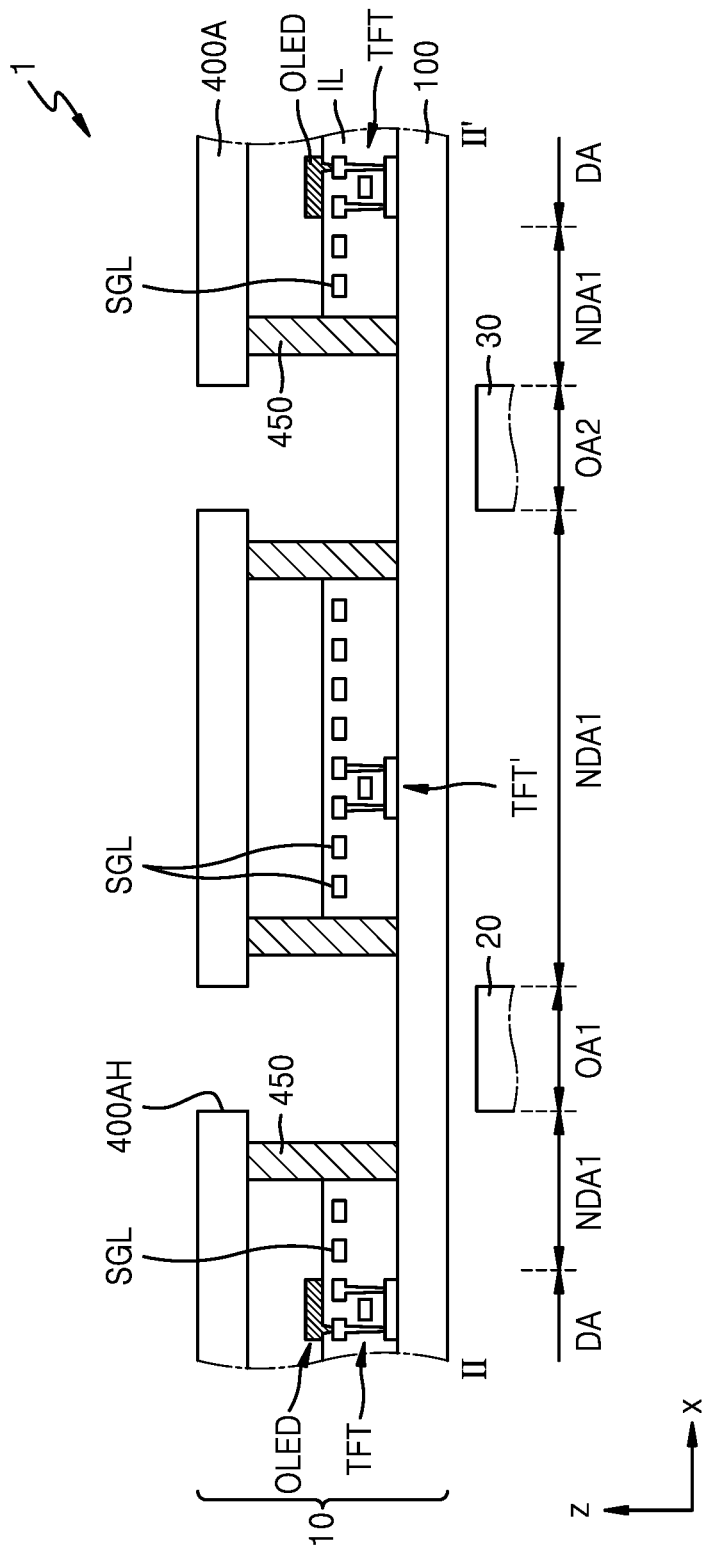

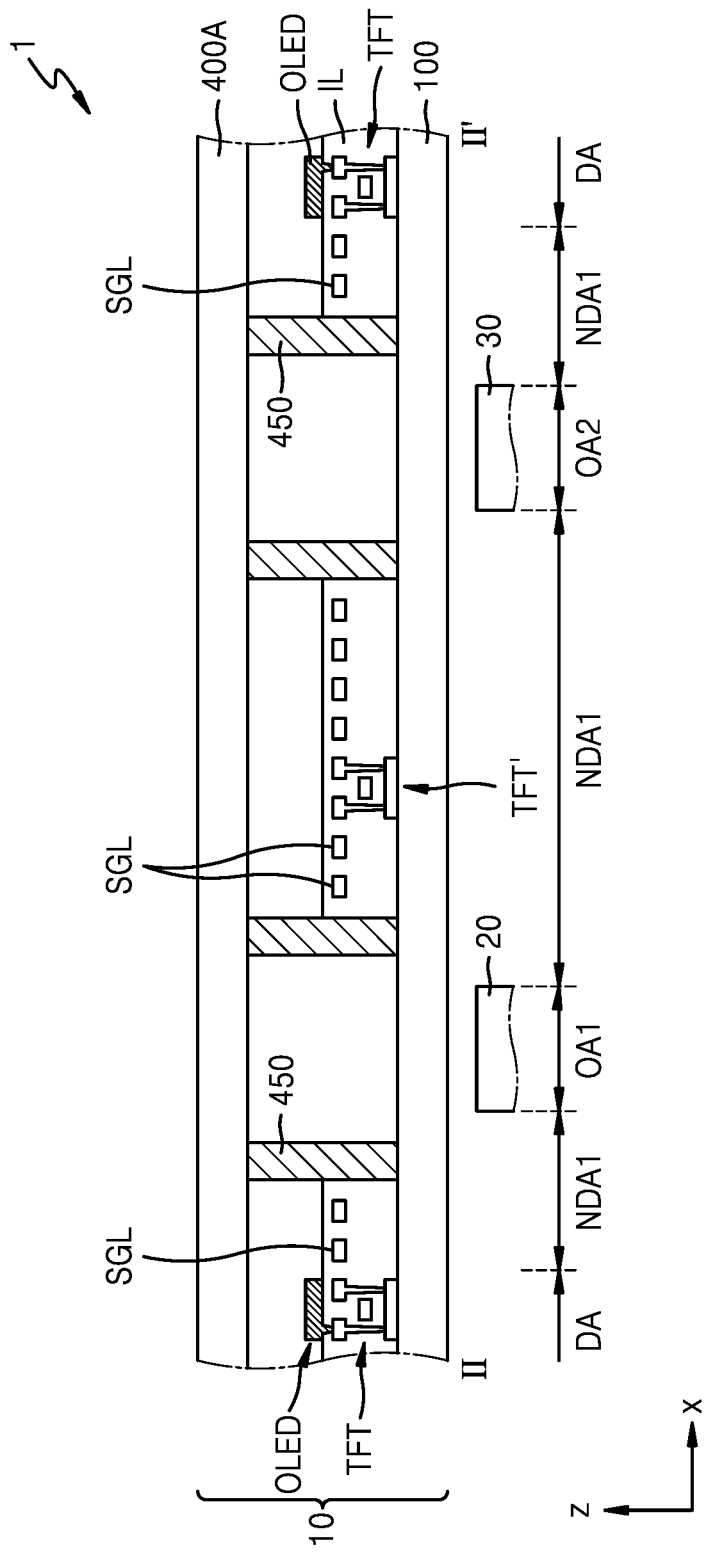

DISPLAY PANEL INCLUDING CONDUCTIVE MEMBER HAVING OPENING

CROSS-REFERENCE TO RELATED APPLICATION

This application claims priority to and the benefit of Korean Patent Application No. 10-2018-0154782 filed on Dec. 4, 2018 in the Korean Intellectual Property Office; the disclosure of the Korean Patent Application is incorporated herein in its entirety by reference.

BACKGROUND

1. Field

The technical field relates to a display panel and a display apparatus including the display panel.

2. Description of the Related Art

A display apparatus typically has a display area for displaying images. The display apparatus may include a display panel for displaying the images.

The display apparatus may perform one or more additional functions in the display area. For example, in addition to displaying images, the display area may receive user inputs.

SUMMARY

One or more embodiments include a display panel including a display area including a plurality of openings or in which functional components are arranged. An embodiment may be related to a display apparatus including the display panel.

According to one or more embodiments, a display panel includes the following elements: a substrate including a first area and a second area, a non-display area surrounding the first and second areas, and a display area surrounding the non-display area; a plurality of display devices in the display area; a plurality of wires bypassing at least a portion of an edge of each of the first and second areas in the non-display area; and an electrode layer covering at least one of the plurality of wires in the non-display area and having at least one opening between the first and second areas.

The plurality of wires may include a plurality of data lines extending in a first direction and applying a data signal to the plurality of display devices.

The at least one opening may have a first width in the first direction and a second width in the first direction, and the first width may be different from the second width.

The at least one opening may have a first edge crossing the data lines, and at least a portion of the first edge is a curved line.

The electrode layer may include a plurality of holes apart from one another, and a size of each of the plurality of holes may be less than a size of the at least one opening.

The electrode layer may include a plurality of holes apart from one another, and at least one of the plurality of holes may overlap one or more of the plurality of wires, the one or more wires bypassing at least the portion of the edge of each of the first and second areas in the non-display area.

The at least one opening may not overlap one or more of the plurality of wires, the one or more wires bypassing at least the portion of the edge of each of the first and second areas in the non-display area.

The plurality of wires may include a plurality of data lines extending in a first direction and applying a data signal to the plurality of display devices, and a plurality of initialization voltage lines extending in a second direction crossing the first direction and connected to the electrode layer, and the plurality of initialization voltage lines may have a constant voltage.

The electrode layer may have a constant voltage.

The plurality of display devices may include a pixel electrode, an opposite electrode, and an emission layer between the pixel electrode and the opposite electrode.

The electrode layer may include a same material as the pixel electrode.

The electrode layer may include a hole corresponding to each of the first area and the second area.

According to one or more embodiments, a display panel includes the following elements: a substrate including a first area and a second area, a non-display area surrounding the first and second areas, and a display area surrounding the non-display area; a plurality of display devices arranged in the display area and each including a pixel electrode, an opposite electrode, and an emission layer between the pixel electrode and the opposite electrode; a plurality of wires bypassing at least a portion of an edge of each of the first and second areas in the non-display area; and an electrode layer covering at least one of the plurality of wires in the non-display area and having at least one opening extending in a second direction crossing a virtual line connecting a center of the first area and a center of the second area.

The plurality of wires may include a plurality of data lines extending in a first direction and applying a data signal to the plurality of display devices, the plurality of data lines may include a first data line and a second data line to correspond to the at least one opening, and a size of an area of the first data line overlapping the electrode layer may be different from a size of an area of the second data line overlapping the electrode layer.

The electrode layer may include a plurality of holes apart from one another, and at least one of the plurality of holes may surround the first and second areas.

The plurality of wires may include a plurality of data lines extending in a first direction and applying a data signal to the plurality of display devices, and a plurality of initialization voltage lines extending in the second direction crossing the first direction and connected to the electrode layer.

The plurality of initialization voltage lines may have a constant voltage, and the electrode layer may have a same level of voltage as the plurality of initialization voltage lines.

The electrode layer may include a same material as the pixel electrode.

The display panel may further include an organic insulating layer below the electrode layer, and the electrode layer may expose at least a portion of the organic insulating layer through the at least one opening.

The display panel may further include at least one groove provided in the non-display area and more adjacent to the first and second areas than the plurality of wires, and an encapsulation layer covering the plurality of display devices and including an inorganic encapsulation layer and an organic encapsulation layer.

An embodiment may be related to a display panel. The display panel may include a first hole, a second hole, a display element, a switching element, a first wire, and a conductive member. The second hole may be spaced from the first hole. The switching element may be electrically connected to the display element. The first wire may bypass the first hole in a plan view of the display panel and may be electrically connected to the switching element. The conductive member may surround each of the first hole and the second hole in the plan view of the display panel, may have a first opening between the first hole and the second hole in the plan view of the display panel, and may partially cover the first wire. A first edge portion of the conductive member may intersect the first wire and may be positioned between the display element and the first hole in the plan view of the display panel.

The first wire may be a data line electrically connected to a source electrode of the switching element for applying a data signal to the display element.

The first opening may have a first width in a first direction and may have a second width in the first direction. The first width may be unequal to the second width.

The first opening may have a first edge crossing the data line and including at least a curved portion.

The conductive member may include holes spaced from one another. Each of the holes may be smaller than the first opening in the plan view of the display panel.

The conductive member comprises holes spaced from one another. At least one of the holes may partially expose the first wire.

The first opening may be spaced from the first wire in the plan view of the display panel.

The display panel may include an initialization voltage line electrically connected to the conductive member and configured to provide a constant voltage to the conductive member.

The conductive member may have a constant voltage unequal to 0 V.

The display element may include a pixel electrode, an opposite electrode, and an emission layer between the pixel electrode and the opposite electrode.

A material of the conductive member may be identical to a material of the pixel electrode.

The conductive member may include a first hole and a second hole respectively corresponding to the first hole and the second hole.

An edge of the first opening may cross a geometric line connecting a center of the first area and a center of the second area.

The display panel may include the following elements: a first data line intersecting the first opening and configured to transmit a first data signal; and a second data line intersecting the first opening and configured to transmit a second signal. A total overlap between the first data line and the conductive member may be larger than a total overlap between the second data line and the conductive member.

The conductive member may include a first hole and a second hole spaced from each other and respectively surrounding the first hole and the second hole in the plan view of the display panel.

The first wire may be electrically connected to a gate electrode of the switching element and may further bypass the second hole in the plan view of the display panel.

The display panel may include an initialization voltage line extending in a direction and having a constant voltage unequal to 0 V. The first opening may be between the first hole and the second hole in the direction. The conductive member may have the constant voltage.

A curved portion of the first wire may be covered by the conductive member and may be spaced from the first opening in the plan view of the display panel.

The display panel may include an organic insulating layer overlapping the conductive member. The conductive member may expose at least a portion of the organic insulating layer through the first opening.

The display panel may include a groove and an encapsulation layer. A portion of the groove may be positioned between the first hole and a portion of the first wire. The encapsulation layer may cover the display element, may include an inorganic encapsulation layer, and may include an organic encapsulation layer. A portion of the encapsulation layer may be positioned inside the groove.

BRIEF DESCRIPTION OF THE DRAWINGS

FIG. 2B is a cross-sectional view of a display panel according to an embodiment.

FIG. 2C is a cross-sectional view of a display panel according to an embodiment.

DETAILED DESCRIPTION

Figure 1:
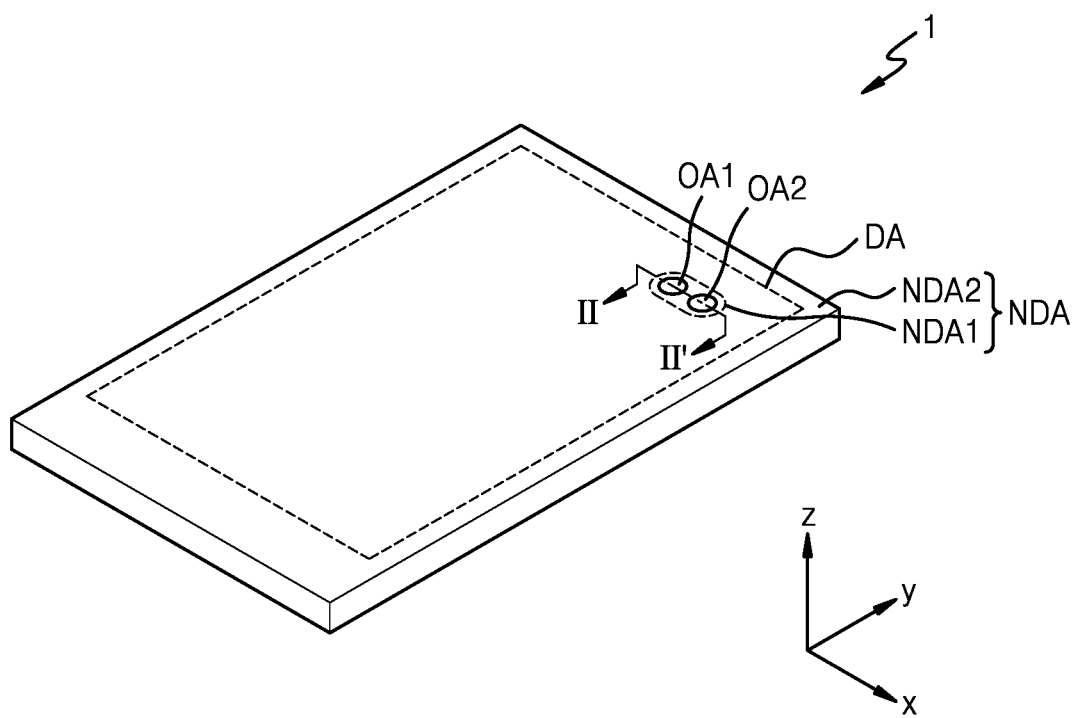
FIG. 1 is a schematic perspective view of a display apparatus according to an embodiment.

Example embodiments are described with reference to the drawings. All changes, equivalents, and substitutes do not depart from the spirit and technical scope of practical embodiments.

Although the terms "first," "second," etc. may be used to describe various components, these components should not be limited by these terms. These terms are used to distinguish one component from another. A first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly or indirectly on the second element, and one or more intervening elements may be present between the first element and the second element.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Like reference numerals may refer to like elements in this application. The term "and/or" may include any and all combinations of one or more of the associated items. Expressions such as "at least one of," when preceding a list of elements, may modify the entire list of elements and may not modify the individual elements of the list. Sizes of elements in the drawings may be exaggerated for convenience of explanation.

The term "apparatus" may mean "device." The term "conductive" may mean "electrically conductive." The term "trace line" may mean "conductive line." The term "connect" may mean "electrically connect." The term "insulate" may mean "electrically insulate." The term "opening" may mean "hole." The term "opening area" may mean "opening." The term "the same as" may mean "equal to." The term "different" may mean "unequal." The term "contact" may mean "directly contact." The term "first area" may mean "area corresponding to a first hole," "area of a first hole," or "first hole." The term "second area" may mean "area corresponding to a second hole," "area of a second hole," or "second hole." The expression that a hole/opening overlaps an element may mean that the hole/opening (at least partially) exposes the element and/or that the hole/opening is positioned over the element. The term "apart" may mean "spaced." The term "electrode layer" may mean "conductive member."

FIG. 1 is a schematic perspective view of a display apparatus 1 according to an embodiment.

Referring to FIG. 1, the display apparatus 1 may include a display area DA for emitting light and may include a non-display area NDA not emitting light.

The display apparatus 1 may provide an image at the display area DA. The display apparatus 1 may include one of a liquid crystal display, an electrophoretic display, an organic light-emitting display, an inorganic light-emitting display, a quantum dot light-emitting display, a field emission display, a surface-conduction electron-emitter display, a plasma display, a cathode ray display, etc. An organic light-emitting display apparatus is described as an example.

The display apparatus 1 may include a first area OA1 and a second area OA2. The first area OA1 and the second area OA2 are where electronic elements are arranged. The first area OA1 and the second area OA2 may include/be cavities, opening areas, and/or transmission areas, through which light and/or sound may be output or received by the electronic elements. FIG. 1 illustrates that there are two opening or transmission areas, namely, the first area OA1 and the second area OA2. There may be three or more transmission areas.

According to an embodiment, when light passes through the first area OA1 or the second area OA2, light transmission may be equal to or greater than about 50%, more preferably, equal to or greater than about 70%, about 75%, about 80%, or about 85%.

The non-display area NDA may include a first non-display area NDA1 surrounding the first area OA1 and the second area OA2, and a second non-display area NDA2 surrounding the display area DA. The first non-display area NDA1 may substantially surround the first area OA1 and the second area OA2, the display area DA may substantially surround the first non-display area NDA1, and the second non-display area NDA2 may substantially surround the display area DA.

FIG. 1 illustrates that the first area OA1 and the second area OA2 are arranged at an upper right side of the display area DA. According to embodiments, the first area OA1 and the second area OA2 may be positioned at other locations.

Figure 2A:
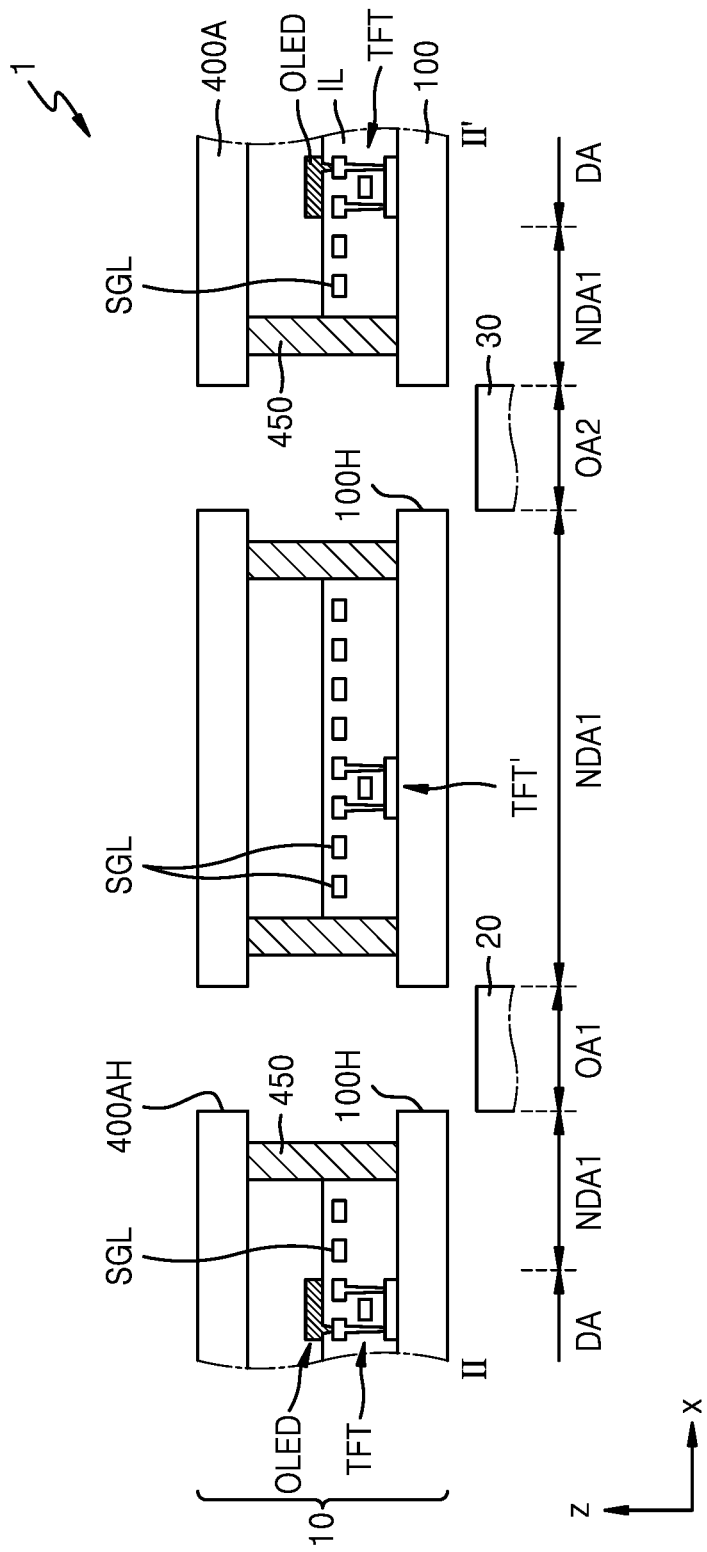
FIG. 2A is a cross-sectional view of a display panel according to an embodiment.

FIGS. 2A through 2C are cross-sectional views taken along a line II-II' of FIG. 1 according to embodiments.

Referring to FIG. 2A, the display apparatus 1 may include a display panel 10 including a display element, e.g., an organic light-emitting diode OLED. The display panel 10 may include a first electronic element 20 and a second electronic element 30 respectively corresponding to a first area OA1 and a second area OA2 of the display panel 10. Although not shown, components such as an input sensing member for sensing a touch input, a reflection prevention member including a polarizer and a retarder, or a color filter and a black matrix, and a transparent window, may further be arranged on the display panel 10.

The display panel 10 may include a substrate 100, an encapsulation substrate 400A facing the substrate 100, and a sealing member 450 between the substrate 100 and the encapsulation substrate 400A.

The substrate 100 may include glass or polymer resins. The polymer resins may include polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose acetate propionate (CAP), or the like. The substrate 100 including the polymer resins may be flexible, rollable, or bendable. The substrate 100 may have a multi-layered structure including a layer including the polymer resins described above and an inorganic layer (not shown). The encapsulation substrate 400A may include glass or the polymer resins described above.

A thin film transistor TFT, an organic light-emitting diode OLED connected to the thin film transistor TFT, and signal lines SGL may be arranged in the display area DA of the substrate 100. The signal lines SGL and a dummy thin film transistor TFT' may be arranged in the first non-display area NDA1 of the substrate 100.

The signal lines SGL may provide certain signals (e.g., the data signal, scan signals, etc.) to display elements spaced from one another.

The display panel 10 may include through-holes corresponding to the first and second areas OA1 and OA2. For example, the substrate 100 and the encapsulation substrate 400A may respectively include through-holes 100H and 400AH corresponding to the first and second areas OA1 and OA2. Portions of an insulating layer IL or components between the substrate 100 and the encapsulation substrate 400A corresponding to the first and second areas OA1 and OA2 may be removed.

FIG. 2A illustrates that the sealing members 450 are arranged at sides of the first area OA1 and sides of the second area OA2 in a cross-sectional view. Each of the first and second areas OA1 and OA2 is substantially surrounded by a sealing member 450 in a plan view.

The first and second electronic elements 20 and 30 may be located in the first area OA1 and the second area OA2, respectively. The first and second electronic elements 20 and 30 may be electronic elements using and/or producing light or sound. For example, at least one of the electronic elements may be one of a sensor receiving and using light, such as an infrared sensor, a camera capturing an image by receiving light, a sensor measuring a distance or recognizing a fingerprint, etc. (by outputting and sensing light or sound), a small lamp outputting light, a speaker outputting sound, etc. In embodiments, light of predetermined wavelength ranges, such as one or more of visible rays, infrared rays, ultraviolet rays, etc., may be used.

When the display panel 10 includes the through-holes 100H and 400AH corresponding to the first and second areas OA1 and OA2 as illustrated in FIG. 2A, light or sound may be effectively output or received by the first and second electronic elements 20 and 30.

Referring to FIG. 2B, while the encapsulation substrate 400A may include the through-holes 400AH corresponding to the first and second areas OA1 and OA2, the substrate 100 may not include a through-hole. Referring to FIG. 2C, both the substrate 100 and the encapsulation substrate 400A may not include any through-holes corresponding to the first and second areas OA1 and OA2. Even when the substrate 100 does not include the through hole 100H as illustrated in FIGS. 2B and 2C, light transmission for the first and second electronic elements 20 and 30 may be optimized by removing at least a portion of the insulating layer IL or components between the substrate 100 and the encapsulation substrate 400A that correspond to the first and second areas OA1 and OA2. When the display apparatus 1 includes the display panel 10 illustrated in FIGS. 2B and 2C, the first and second electronic elements 20 and 30 may be electronic elements using light.

Figure 3A:
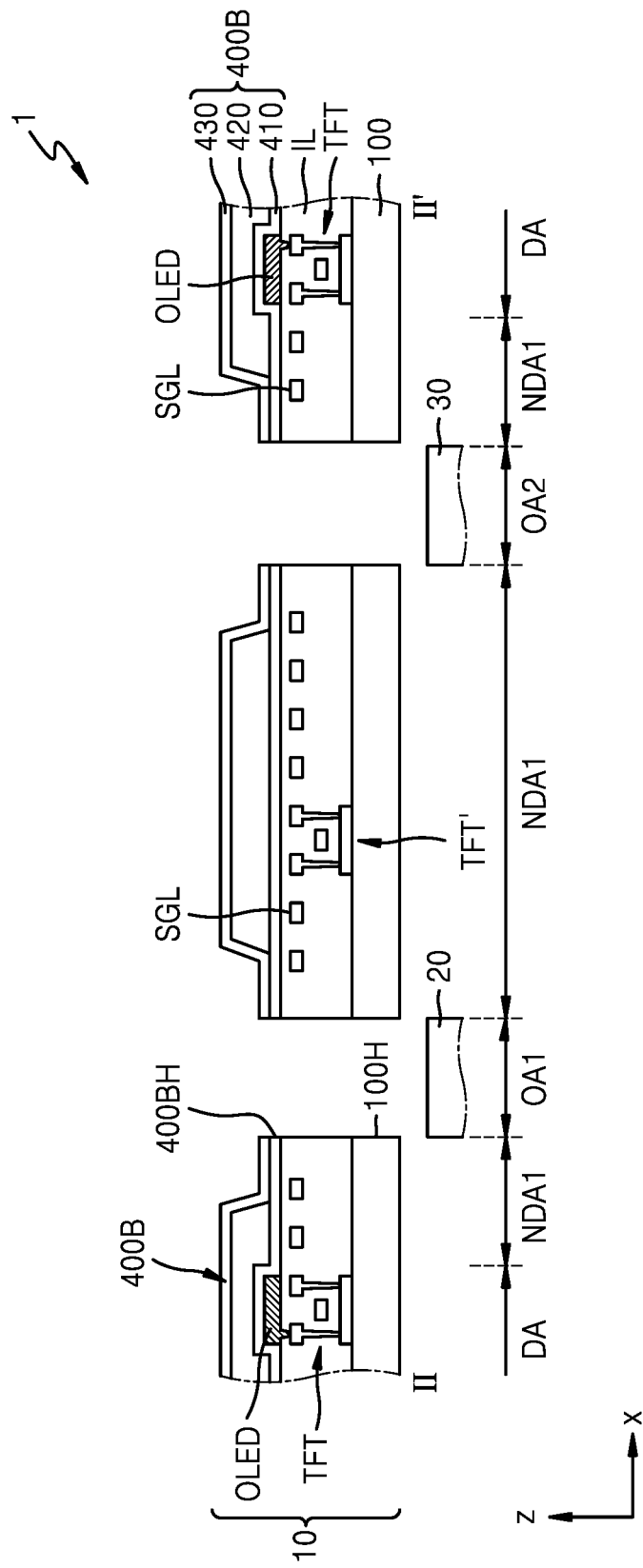
FIG. 3A is a cross-sectional view of a display panel according to an embodiment.
Figure 3B:
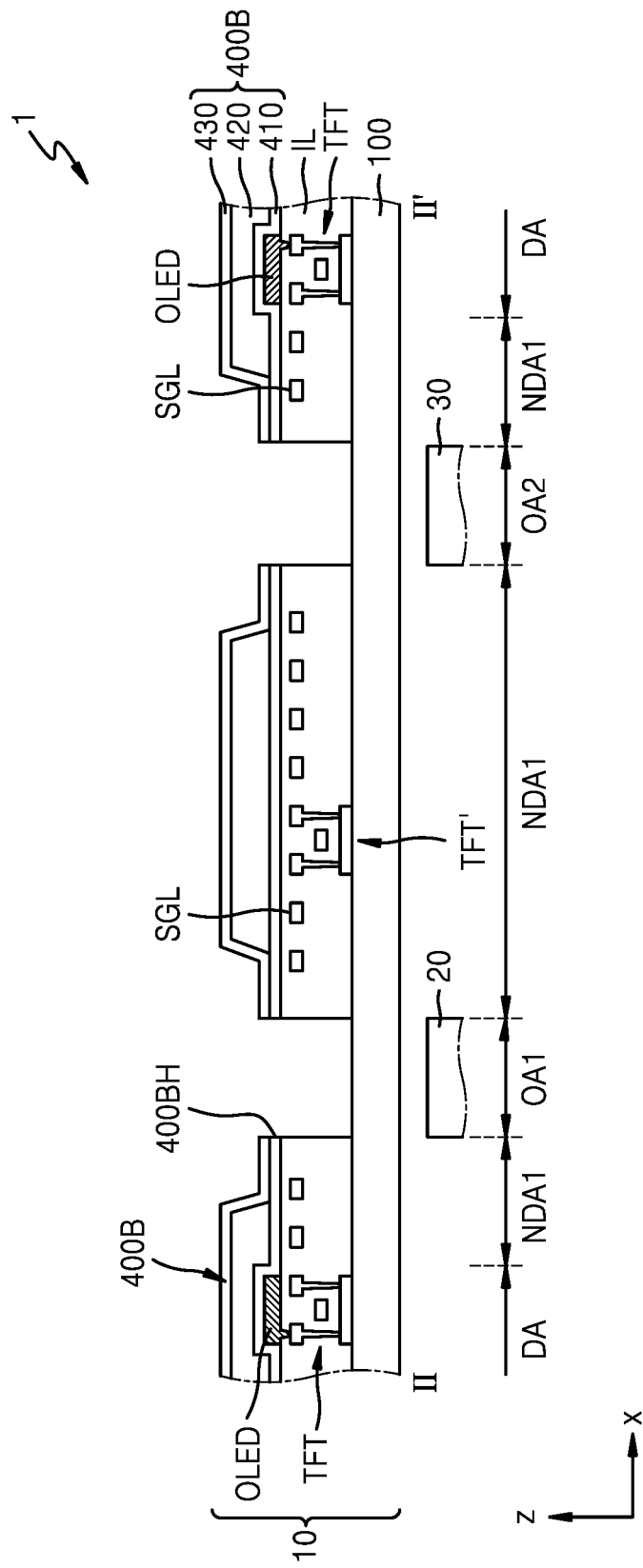
FIG. 3B is a cross-sectional view of a display panel according to an embodiment.
Figure 3C:
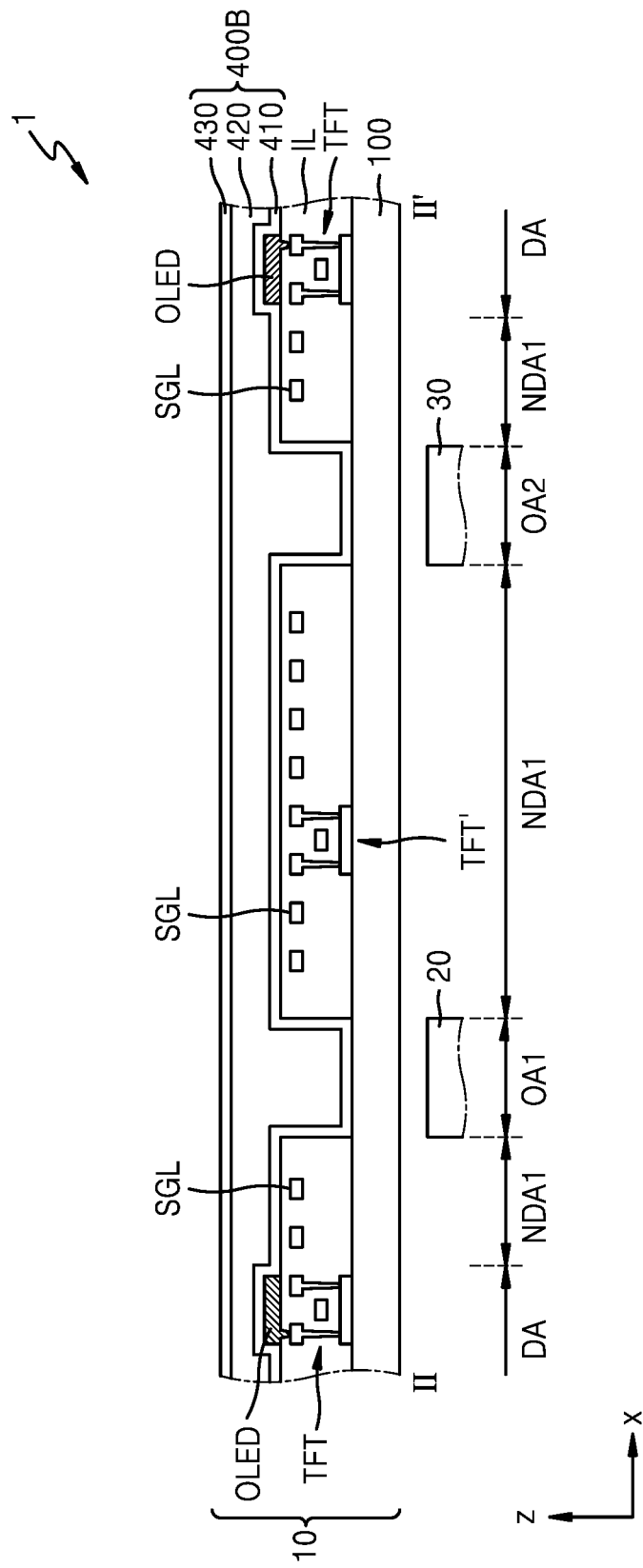
FIG. 3C is a cross-sectional view of a display panel according to an embodiment.

FIGS. 3A through 3C are cross-sectional views taken along a line II-II' of FIG. 1 according to embodiments.

Referring to FIG. 3A, like the display apparatus 1 described above with reference to FIG. 2A, the display apparatus 1 may include the display panel 10 including a display element, and may include first and second electronic elements 20 and 30 respectively corresponding to first and second areas OA1 and OA2 of the display panel 10. Although not shown, the display apparatus 1 may further include an input sensing member sensing a touch input, a reflection prevention member, a window, etc., arranged on the display panel 10.

The display panel 10 may include a thin film encapsulation layer 400B, such that the flexibility of the display panel 10 may be optimized.

The thin film encapsulation layer 400B may include at least one inorganic encapsulation layer and at least one organic encapsulation layer. FIG. 3A illustrates a first inorganic encapsulation layer 410, a second inorganic encapsulation layer 430, and an organic encapsulation layer 420 between the first and second inorganic encapsulation layers 410 and 430.

The first and second inorganic encapsulation layers 410 and 430 may include one or more inorganic insulating materials from among aluminum oxide, titanium oxide, tantalum oxide, hafnium oxide, zinc oxide, silicon oxide, silicon nitride, and silicon oxynitride. The organic encapsulation layer 420 may include a polymer-based material. The polymer-based material may include one of an acryl-based resin, an epoxy-based resin, PI, polyethylene, etc.

The display panel 10 may include through-holes 100H and 400BH corresponding to the first and second areas OA1 and OA2. For example, the substrate 100 and the thin film encapsulation layer 400B may include the through-holes 100H and 400BH corresponding to the first and second areas OA1 and OA2. First and second electronic elements 20 and 30 using and/or producing light and/or sound may be arranged at the first and second areas OA1 and OA2.

Referring to FIG. 3B, while the thin film encapsulation layer 400B may include the through-holes 400BH corresponding to the first and second areas OA1 and OA2, the substrate 100 may not include a through-hole. Referring to FIG. 3C, both the substrate 100 and the thin film encapsulation layer 400B may not include any through-holes corresponding to the first and second areas OA1 and OA2. Even when the substrate 100 does not include the through hole 100H as illustrated in FIGS. 3B and 3C, light transmission for the first and second electronic elements 20 and 30 may be optimized by removing at least a portion of the insulating layer IL or components between the substrate 100 and the thin film encapsulation layer 400B that correspond to the first and second areas OA1 and OA2.

When the thin film encapsulation layer 400B includes the through-holes 400BH, as illustrated in FIGS. 3A and 3B, each of the at least one inorganic encapsulation layer and the at least one organic encapsulation layer may include holes corresponding to the through-holes 400BH. The hole of the organic encapsulation layer may be greater than the hole of the inorganic encapsulation layer, so that the first and second inorganic encapsulation layers 410 and 430 may directly contact each other around the first and second areas OA1 and OA2.

When the thin film encapsulation layer 400B does not include a through-hole as illustrated in FIG. 3C, each of the at least one inorganic encapsulation layer and the at least one organic encapsulation layer may cover the first and second areas OA1 and OA2. A portion of the insulating layer IL between the substrate 100 and the thin film encapsulation layer 400B may be removed. FIG. 3A illustrates that portions of the insulating layer IL corresponding to the first and second areas OA1 and OA2 are completely removed. Only some layers of the insulating layer IL including multiple layers may be removed.

Figure 4:
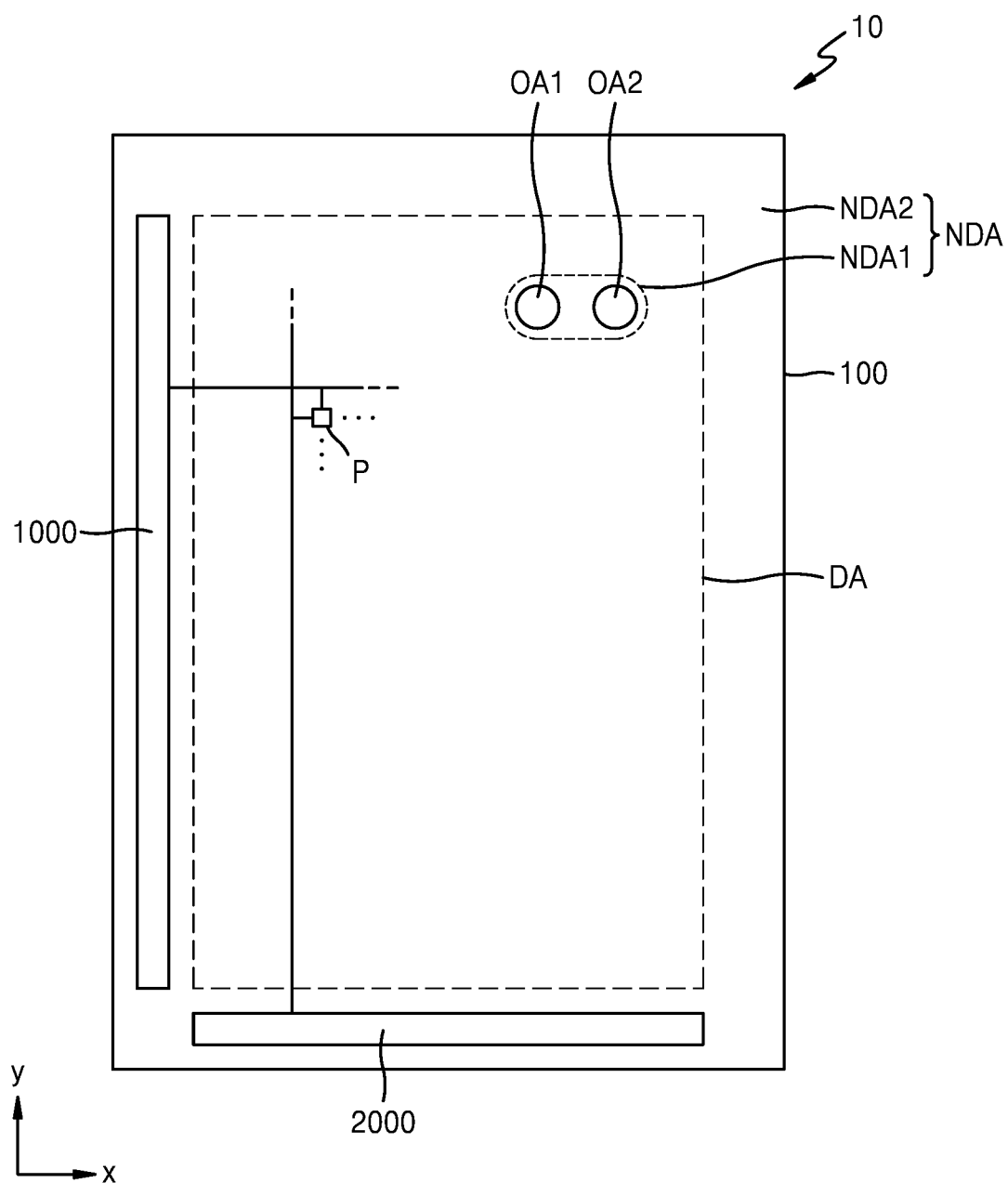
FIG. 4 is a schematic plan view of a display panel according to an embodiment.

FIG. 4 is a schematic plan view of the display panel 10 according to an embodiment.

Referring to FIG. 4, the display panel 10 may include a plurality of pixels P arranged in the display area DA. Each of the pixels P may include a display element, such as an organic light-emitting diode. The pixel P may emit, for example, red, green, blue, or white light, from the organic light-emitting diode. In this specification, the pixel P may be a pixel emitting any one of red, green, blue, and white light described above. The display area DA may be covered by the encapsulation member described with reference to FIGS. 2A through 3C and may be protected from external materials, water, etc.

The first non-display area NDA1 may surround both the first and second areas OA1 and OA2. The first non-display area NDA1 is an area in which an image is not realized, and signal lines providing signals to the pixels P provided around the first and second areas OA1 and OA2 may be arranged in the first non-display area NDA1.

The second non-display area NDA2 may include a scan driver 1000 providing a scan signal to the pixels P, a data driver 2000 providing a data signal to the pixels P, a power wire (not shown) providing a driving voltage and a common voltage, etc.

Figure 5A:
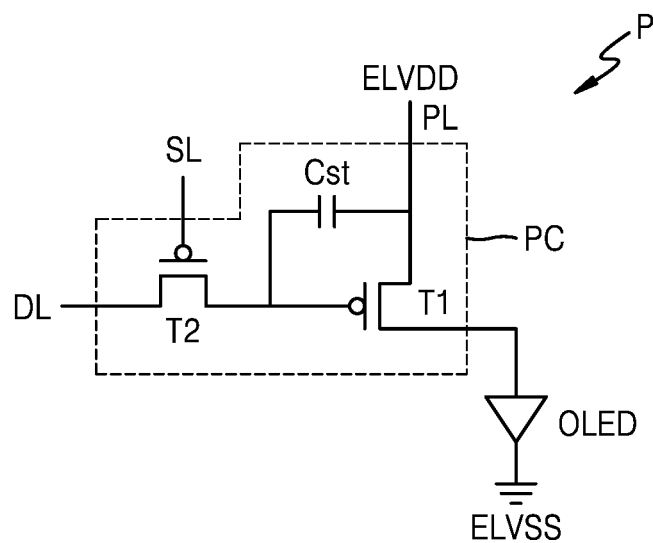
FIG. 5A is an equivalent circuit diagram of a pixel according to an embodiment.
Figure 5B:
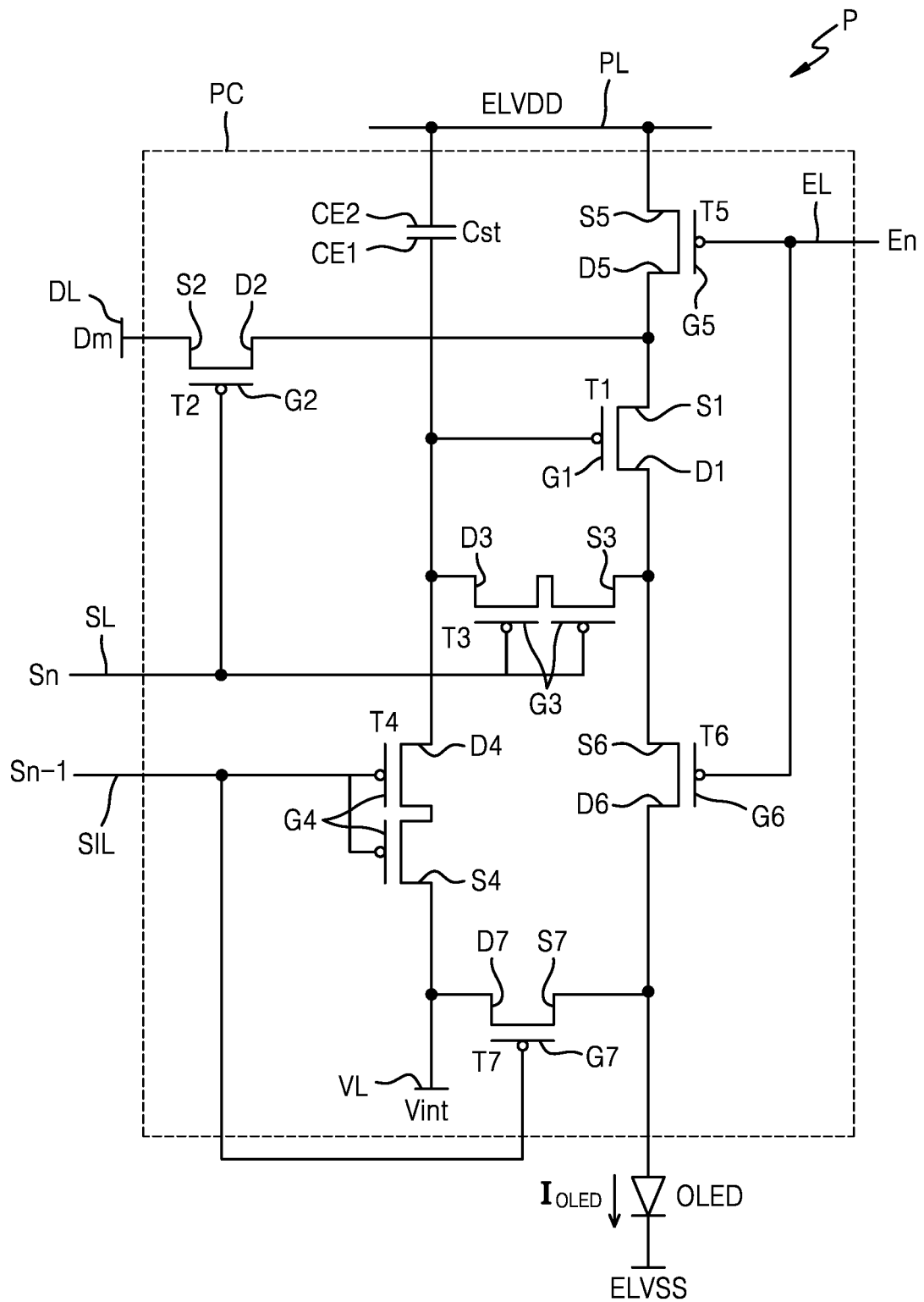
FIG. 5B is an equivalent circuit diagram of a pixel according to an embodiment.

FIGS. 5A and 5B are schematic equivalent circuit diagrams of a pixel of a display panel, according to embodiments.

Referring to FIG. 5A, each pixel P may include a pixel circuit PC and an organic light-emitting diode OLED connected to the pixel circuit PC. The pixel circuit PC may include a driving thin film transistor T1, a switching thin film transistor T2, and a storage capacitor Cst.

The switching thin film transistor T2 may be connected to a scan line SL and a data line DL and may transmit a data voltage input from the data line DL to the driving thin film transistor T1 according to a switching voltage input from the scan line SL. The storage capacitor Cst may be connected to the switching thin film transistor T2 and a driving voltage line PL and may store a voltage corresponding to a difference between a voltage transmitted from the switching thin film transistor T2 and a driving voltage ELVDD supplied to the driving voltage line PL.

The driving thin film transistor T1 may be connected to the driving voltage line PL and the storage capacitor Cst and may control a driving current flowing from the driving voltage line PL through the organic light-emitting diode OLED in correspondence to the voltage value stored in the storage capacitor Cst. The organic light-emitting diode OLED may emit light having a certain brightness in correspondence to the driving current. An opposite electrode (e.g., a cathode) of the organic light-emitting diode OLED may receive a common voltage ELVSS.

In FIG. 5A, it is described that the pixel circuit PC includes two thin film transistors and one storage capacitor. The number of thin film transistors and the number of storage capacitors may be configured according to a design of the pixel circuit PC.

Referring to FIG. 5B, the pixel circuit PC may include a plurality of thin film transistors and a plurality of storage capacitors. The plurality of thin film transistors and the plurality of storage capacitors may be connected to signal lines SL, SIL, EL, and DL, an initialization voltage line VL, and a driving voltage line PL.

FIG. 5B illustrates that each pixel P is connected to the signal lines SL, SIL, EL, and DL, the initialization voltage line VL, and the driving voltage line PL. According to an embodiment, at least one of the signal lines SL, SIL, EL, and DL, the initialization voltage line VL, the driving voltage line PL, etc. may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines may include a scan line SL transmitting a scan signal GW, a previous scan line SIL transmitting a previous scan signal SI to the first initialization thin film transistor T4 and the second initialization thin film transistor T7, an emission control line EL transmitting an emission control signal EM to the operation control thin film transistor T5 and the emission control thin film transistor T6, and a data line DL crossing the scan line SL and transmitting a data signal Dm. The driving voltage line PL may transmit the driving voltage ELVDD to the driving thin film transistor T1 and the initialization voltage line VL may transmit an initialization voltage Vint initializing the driving thin film transistor T1 and a pixel electrode.

A driving gate electrode G1 of the driving thin film transistor T1 may be connected to a first storage accumulation plate CE1 of the storage capacitor Cst, a driving source electrode S1 of the driving thin film transistor T1 may be connected to the driving voltage line PL through the operation control thin film transistor T5, and a driving drain electrode D1 of the driving thin film transistor T1 may be electrically connected to the pixel electrode of the organic light-emitting diode OLED through the emission control thin film transistor T6. The driving thin film transistor T1 may receive a data signal Dm and may supply a driving current $I_{OLED}$ to the organic light-emitting diode OLED, according to a switching operation of the switching thin film transistor T2.

A switching gate electrode G2 of the switching thin film transistor T2 may be connected to the scan line SL, a switching source electrode S2 of the switching thin film transistor T2 may be connected to the data line DL, and a switching drain electrode D2 of the switching thin film transistor T2 may be connected to the driving source electrode S1 of the driving thin film transistor T1 and may be connected to the driving voltage line PL through the operation control thin film transistor T5. The switching thin film transistor T2 may perform a switching operation, whereby the switching thin film transistor T2 may be turned on according to the scan signal Sn transmitted through the scan line SL and may transmit the data signal Dm received through the data line DL to the driving source electrode S1 of the driving thin film transistor T1.

A compensation gate electrode G3 of the compensation thin film transistor T3 may be connected to the scan line SL, a compensation source electrode S3 of the compensation thin film transistor T3 may be connected to the driving drain electrode D1 of the driving thin film transistor T1 and may be connected to the pixel electrode of the organic light-emitting diode OLED through the emission control thin film transistor T6, and a compensation drain electrode D3 of the compensation thin film transistor T3 may be connected to the first storage accumulation plate CE1 of the storage capacitor Cst, a first initialization drain electrode D4 of the first initialization thin film transistor T4, and the driving gate electrode G1 of the driving thin film transistor T1. The compensation thin film transistor T3 may be turned on according to the scan signal GW received through the scan line SL and may electrically connect the driving gate electrode G1 to the driving drain electrode D1 of the driving thin film transistor T1 to diode-connect the driving thin film transistor T1.

A first initialization gate electrode G4 of the first initialization thin film transistor T4 may be connected to the previous scan line SIL, a first initialization source electrode S4 of the first initialization thin film transistor T4 may be connected to a second initialization drain electrode D7 of the second initialization thin film transistor T7 and the initialization voltage line VL, and the first initialization drain electrode D4 of the first initialization thin film transistor T4 may be connected to the first storage accumulation plate CE1 of the storage capacitor Cst, the compensation drain electrode D3 of the compensation thin film transistor T3, and the driving gate electrode G1 of the driving thin film transistor T1. The first initialization thin film transistor T4 may perform an initialization operation, whereby the first initialization thin film transistor T4 may transmit the initialization voltage Vint to the driving gate electrode G1 of the driving thin film transistor T1 by being turned on according to the previous scan signal Sn−1 transmitted via the previous scan line SIL, in order to initialize the voltage of the driving gate electrode G1 of the driving thin film transistor T1.

An operation control gate electrode G5 of the operation control thin film transistor T5 may be connected to the emission control line EL, an operation control source electrode S5 of the operation control thin film transistor T5 may be connected to the driving voltage line PL, and an operation control drain electrode D5 of the operation control thin film transistor T5 may be connected to the driving source electrode S1 of the driving thin film transistor T1 and the switching drain electrode D2 of the switching thin film transistor T2.

An emission control gate electrode G6 of the emission control thin film transistor T6 may be connected to the emission control line EL, an emission control source electrode S6 of the emission control thin film transistor T6 may be connected to the driving drain electrode D1 of the driving thin film transistor T1 and the compensation source electrode S3 of the compensation thin film transistor T3, and an emission control drain electrode D6 of the emission control thin film transistor T6 may be electrically connected to the second initialization source electrode S7 of the second initialization thin film transistor T7 and the pixel electrode of the organic light-emitting diode OLED.

The operation control thin film transistor T5 and the emission control thin film transistor T6 may be simultaneously turned on according to an emission control signal EM received through the emission control line EL, so that the driving voltage ELVDD may be transmitted to the organic light-emitting diode OLED to allow the driving current $I_{OLED}$ to flow to the organic light-emitting diode OLED.

The second initialization gate electrode G7 of the second initialization thin film transistor T7 may be connected to the previous scan line SIL, the second initialization source electrode S7 of the second initialization thin film transistor T7 may be connected to the emission control drain electrode D6 of the emission control thin film transistor T6 and the pixel electrode of the organic light-emitting diode OLED, and the second initialization drain electrode D7 of the second initialization thin film transistor T7 may be connected to the first initialization source electrode S4 of the first initialization thin film transistor T4 and the initialization voltage line VL. The second initialization thin film transistor T7 may be turned on according to the previous scan signal GI transmitted through the previous scan line SIL to initialize the pixel electrode of the organic light-emitting diode OLED.

FIG. 5B illustrates that the first initialization thin film transistor T4 and the second initialization thin film transistor T7 are connected to the previous scan line SIL. According to another embodiment, the first initialization thin film transistor T4 may be connected to the previous scan line SIL to be driven according to the previous scan signal GI and the second initialization thin film transistor T7 may be connected to an additional signal line (e.g., a next scan line) to be driven according to a signal transmitted through the additional signal line.

A second storage accumulation plate CE2 of the storage capacitor Cst may be connected to the driving voltage line PL, and the opposite electrode of the organic light-emitting diode OLED may be connected to the common voltage ELVSS. Accordingly, the organic light-emitting diode OLED may emit light by receiving the driving current $I_{OLED}$ from the driving thin film transistor T1, in order to display an image.

FIG. 5B illustrates that the compensation thin film transistor T3 and the first initialization thin film transistor T4 have a dual gate electrode. However, the compensation thin film transistor T3 and the first initialization thin film transistor T4 may have one gate electrode.

Figure 6:
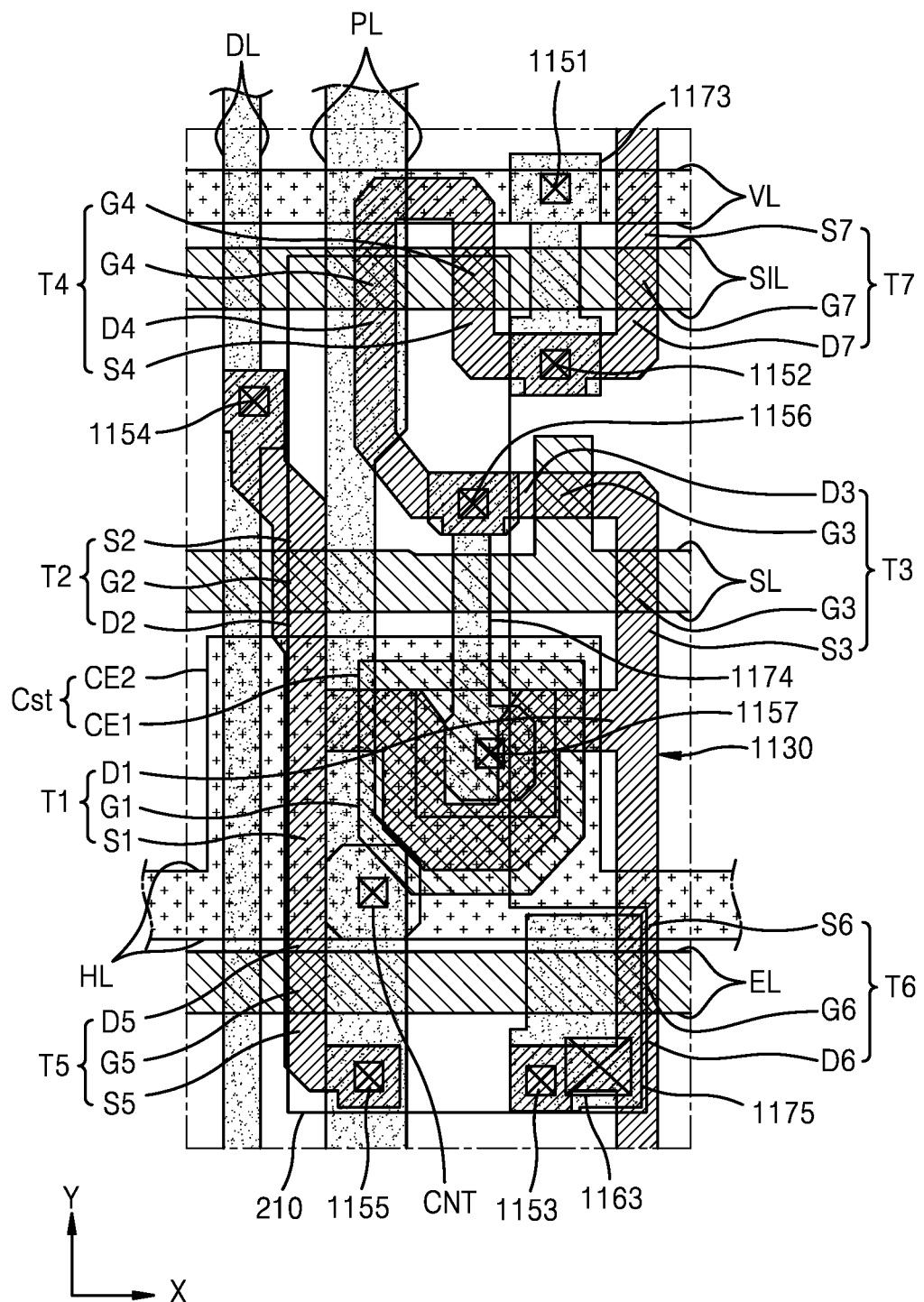
FIG. 6 is a schematic plan view of a pixel circuit according to an embodiment.

FIG. 6 is a plan view of a pixel circuit which may be applied to the display panel according to an embodiment.

Referring to FIG. 6, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be arranged along a semiconductor layer 1130. The semiconductor layer 1130 may be arranged on a substrate including a buffer layer which is an inorganic insulating material.

One or more areas of the semiconductor layer 1130 may correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be connected to one another and may have various bent shapes.

The semiconductor layer 1130 may include a channel area and a source area and a drain area at both sides of the channel area, wherein the source area and the drain area may be a source electrode and a drain electrode of a corresponding thin film transistor. Hereinafter, for convenience, the source area and the drain area will be referred to as the source electrode and the drain electrode, respectively.

The driving thin film transistor T1 may include the driving gate electrode G1 overlapping a driving channel area, and the driving source electrode S1 and the driving drain electrode D1 at both sides of the driving channel area. The driving channel area overlapping the driving gate electrode G1 may have a bent shape, such as an Omega shape, thereby having a great channel length in a small space. When the driving channel area has a great length, a driving range of a gate voltage may be increased, so that gradation of light emitted from the organic light-emitting diode OLED may be more minutely controlled and quality of display may be improved.

The switching thin film transistor T2 may include the switching gate electrode G2 overlapping a switching channel area and the switching source electrode S2 and the switching drain electrode D2 at both sides of the switching channel area. The switching drain electrode D2 may be connected to the driving source electrode S1.

The compensation thin film transistor T3 may be a dual thin film transistor, may include compensation gate electrodes G3 overlapping two compensation channel areas, and may include the compensation source electrode S3 and the compensation drain electrode D3 arranged at both sides of the compensation gate electrode G3. The compensation thin film transistor T3 may be connected to the driving gate electrode G1 of the driving thin film transistor T1 through a node connection line 1174 to be described below.

The first initialization thin film transistor T4 may be a dual thin film transistor, may include the first initialization gate electrode G4 overlapping two first initialization channel areas, and may include the first initialization source electrode S4 and the first initialization drain electrode D4 arranged at both sides of the first initialization gate electrode G4.

The operation control thin film transistor T5 may include the operation control gate electrode G5 overlapping an operation control channel area and the operation control source electrode S4 and the operation control drain electrode D5 arranged at both sides of the operation control gate electrode G5. The operation control drain electrode D5 may be connected to the driving source electrode S1.

The emission control thin film transistor T6 may include the emission control gate electrode G6 overlapping an emission control channel area, and the emission control source electrode S6 and the emission control drain electrode D6 arranged at both sides of the emission control gate electrode G6. The emission control source electrode S6 may be connected to the driving drain electrode D1.

The second initialization thin film transistor T7 may include the second initialization gate electrode G7 overlapping a second initialization channel area, and the second initialization source electrode S7 and the second initialization drain electrode D7 arranged at both sides of the second initialization gate electrode G7.

The thin film transistors described above may be connected to the signal lines SL, SIL, EL, and DL, the initialization voltage line VL, and the driving voltage line PL.

The scan line SL, the previous scan line SIL, the emission control line EL, and the driving gate electrode G1 may be arranged on the semiconductor layer 1130 with one or more intervening insulating layers.

The scan line SL may extend in a second direction. One or more areas of the scan line SL may correspond to the switching gate electrode G4 and the compensation gate electrode G7, respectively. For example, areas of the scan line SL, the areas overlapping channel areas of the first and second initialization driving thin film transistors T4 and T7 may respectively be the first and second initialization gate electrodes G4 and G7.

The previous scan line SIL may extend in the second direction and one or more areas of the previous scan line SIL may correspond to the first and second initialization gate electrodes G4 and G7, respectively. For example, areas of the previous scan line SIL, the areas overlapping the channel areas of the first and second initialization driving thin film transistors T4 and T7, may respectively be the first and second initialization gate electrodes G4 and G7.

The emission control line EL may extend in the second direction. One or more areas of the emission control line EL may correspond to the operation control gate electrode G5 and the emission control gate electrode G6, respectively. For example, areas of the emission control line EL, the areas overlapping channel areas of the operation control thin film transistor T6 and the emission control thin film transistor T7, may respectively be the operation control gate electrode G5 and the emission control gate electrode G6.

The driving gate electrode G1 may include a floating electrode and may be connected to the compensation thin film transistor T3 through the node connection line 1174 described above.

An electrode voltage line HL may be arranged on the scan line SL, the previous scan line SIL, the emission control line EL, and the driving gate electrode G1 described above with (an) insulating layer(s) therebetween.

The electrode voltage line HL may extend in the second direction to cross the data line DL and the driving voltage line PL. A portion of the electrode voltage line HL may cover at least a portion of the driving gate electrode G1 and may form the storage capacitor Cst along with the driving gate electrode G1. For example, the driving gate electrode G1 may be the first storage accumulation plate CE1 of the storage capacitor Cst and a portion of the electrode voltage line HL may be the second storage accumulation plate CE2 of the storage capacitor Cst.

The second storage accumulation plate CE2 of the storage capacitor Cst may be electrically connected to the driving voltage line PL. In relation to this, the electrode voltage line HL may be connected with the driving voltage line PL on the electrode voltage line HL, through a contact hole CNT. Thus, the electrode voltage line HL may have the same voltage level (a constant voltage) as the driving voltage line PL. For example, the electrode voltage line HL may have a constant voltage of +5V. The electrode voltage line HL may be a driving voltage line in a transverse direction.

The driving voltage line PL may extend in a first direction and the electrode voltage line HL electrically connected to the driving voltage line PL may extend in the second direction crossing the first direction, and thus, the plurality of driving voltage lines PL and the plurality of electrode voltage lines HL in the display area may form a mesh structure.

According to the present embodiment, the electrode voltage line HL may be arranged at a different layer from the driving voltage line PL, and a resistivity of the electrode voltage line HL may be greater than a resistivity of the driving voltage line PL.

The data line DL, the driving voltage line PL, an initialization connection line 1173, and the node connection line 1174 may be arranged on the electrode voltage line HL with (an) insulating layer(s) therebetween.

The data line DL may extend in the first direction and may be connected to the switching source electrode S2 of the switching thin film transistor T2 through a contact hole 1154. A portion of the data line DL may be a switching source electrode.

The driving voltage line PL may extend in the first direction and may be connected with the electrode voltage line HL through the contact hole CNT as described above. Also, the driving voltage line PL may be connected to the operation control thin film transistor T5 through a contact hole 1155. The driving voltage line PL may be connected to the operation control drain electrode D5 through the contact hole 1155.

An end of the initialization connection line 1173 may be connected to the first and second initialization thin film transistors T4 and T7 through a contact hole 1152, and the other end of the initialization connection line 1173 may be connected to the initialization voltage line VL to be described below through a contact hole 1151.

An end of the node connection line 1174 may be connected to the compensation drain electrode D3 through a contact hole 1156 and the other end of the node connection line 1174 may be connected to the driving gate electrode G1 through a contact hole 1157.

The initialization voltage line VL may be arranged on the data line DL, the driving voltage line PL, the initialization connection line 1173, and the node connection line 1174 with (an) insulating layer(s) therebetween.

The initialization voltage line VL may extend in the second direction. The initialization voltage line VL may be connected to the first and second initialization thin film transistors T4 and T7 through the initialization connection line 1173. The initialization voltage line VL may have a constant voltage (e.g., −2V, etc.).

The initialization voltage line VL may be arranged on the same layer and may include the same material as the second storage accumulation plate CE2, that is, the electrode voltage line HL. In the display area DA, the pixel electrode of the organic light-emitting diode OLED may be connected to the emission control thin film transistor T6. The pixel electrode may be connected to a connection metal 1175 through a contact hole 1163, and the connection metal 1175 may be connected to the emission control drain electrode D6 through a contact hole 1153.

Figure 7:
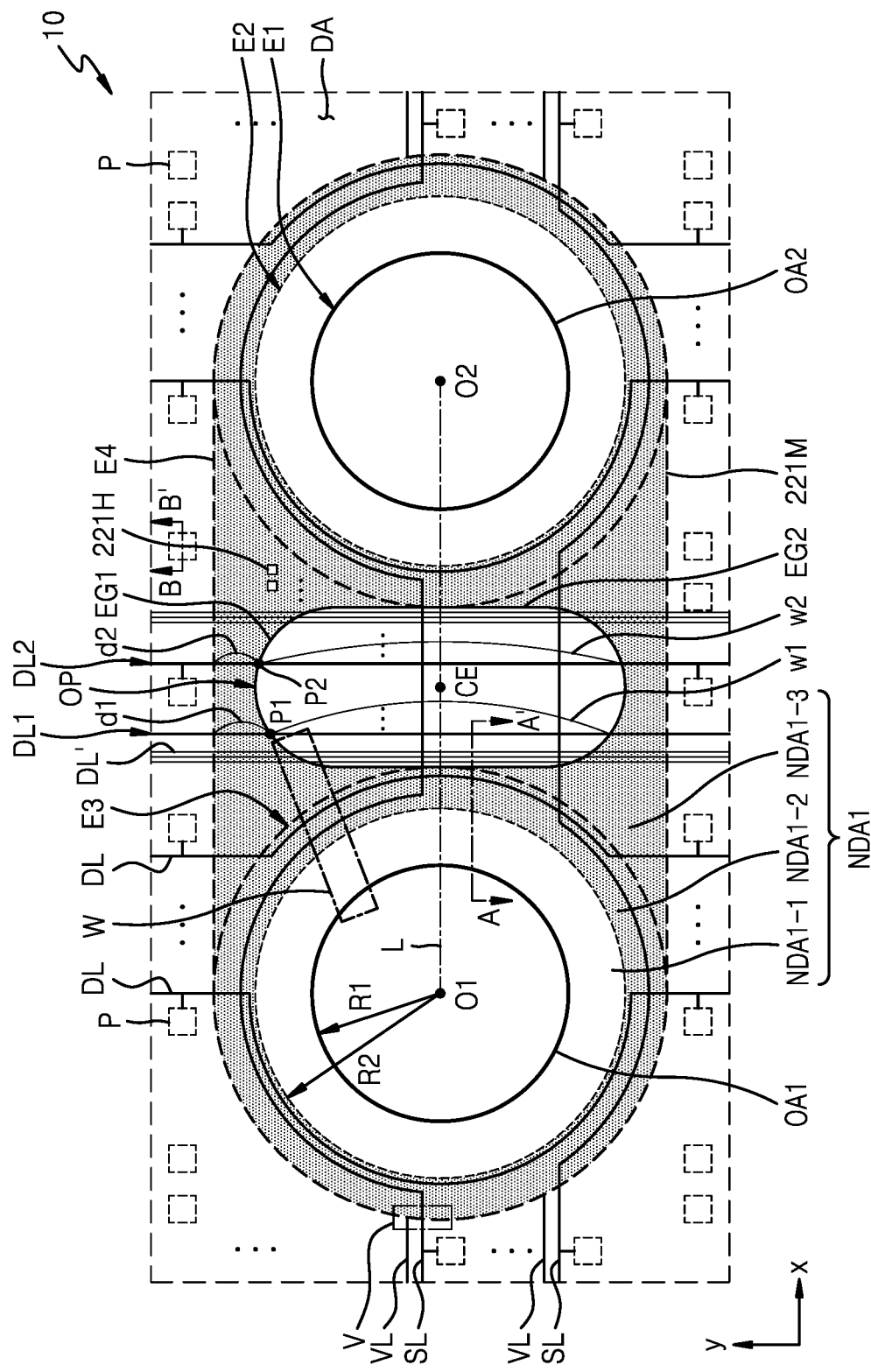
FIG. 7 is a schematic plan view of (a portion of) a display panel according to an embodiment.
Figure 8:
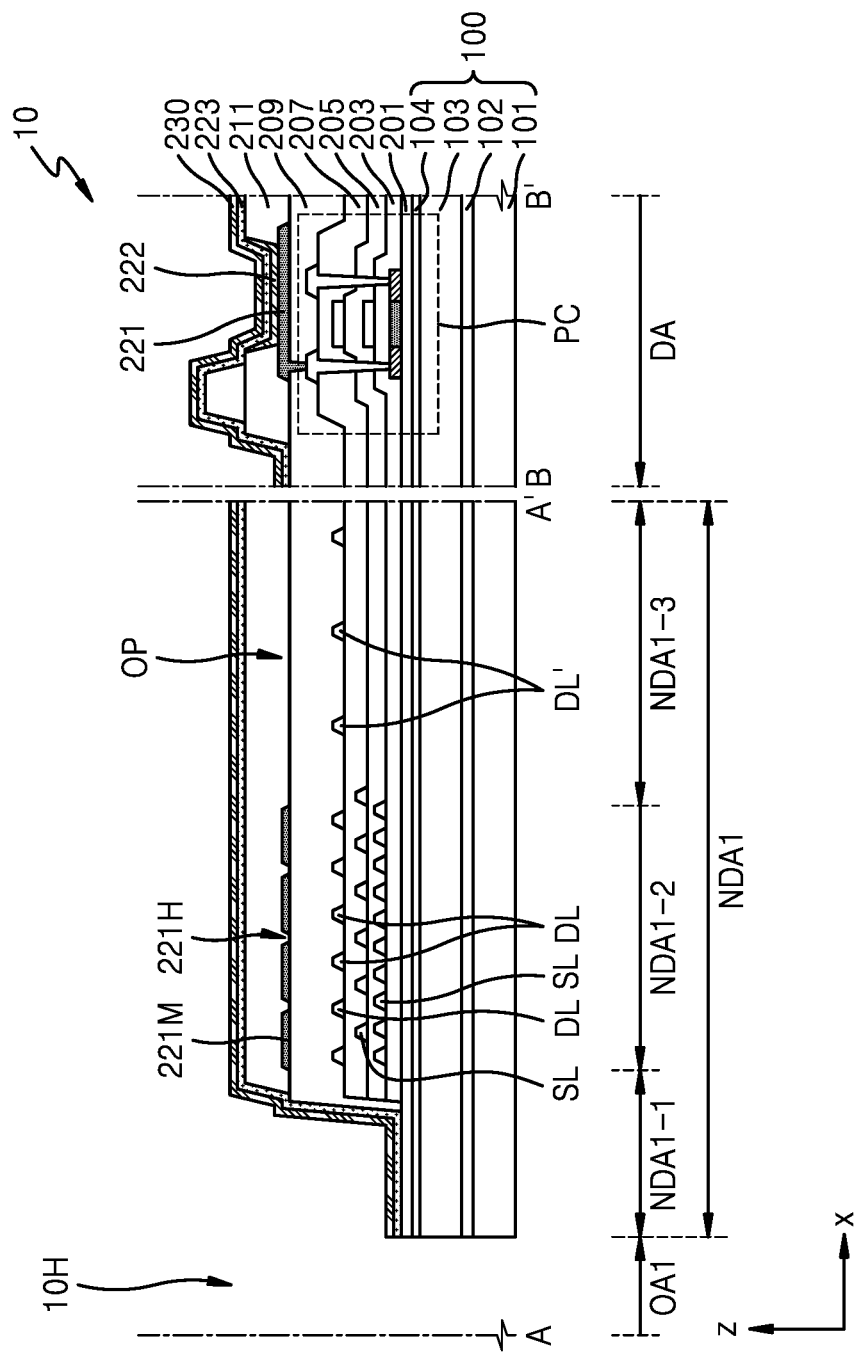
FIG. 8 is a cross-sectional view taken along a line A-A' and a line B-B' of FIG. 7 according to an embodiment.
Figure 9:
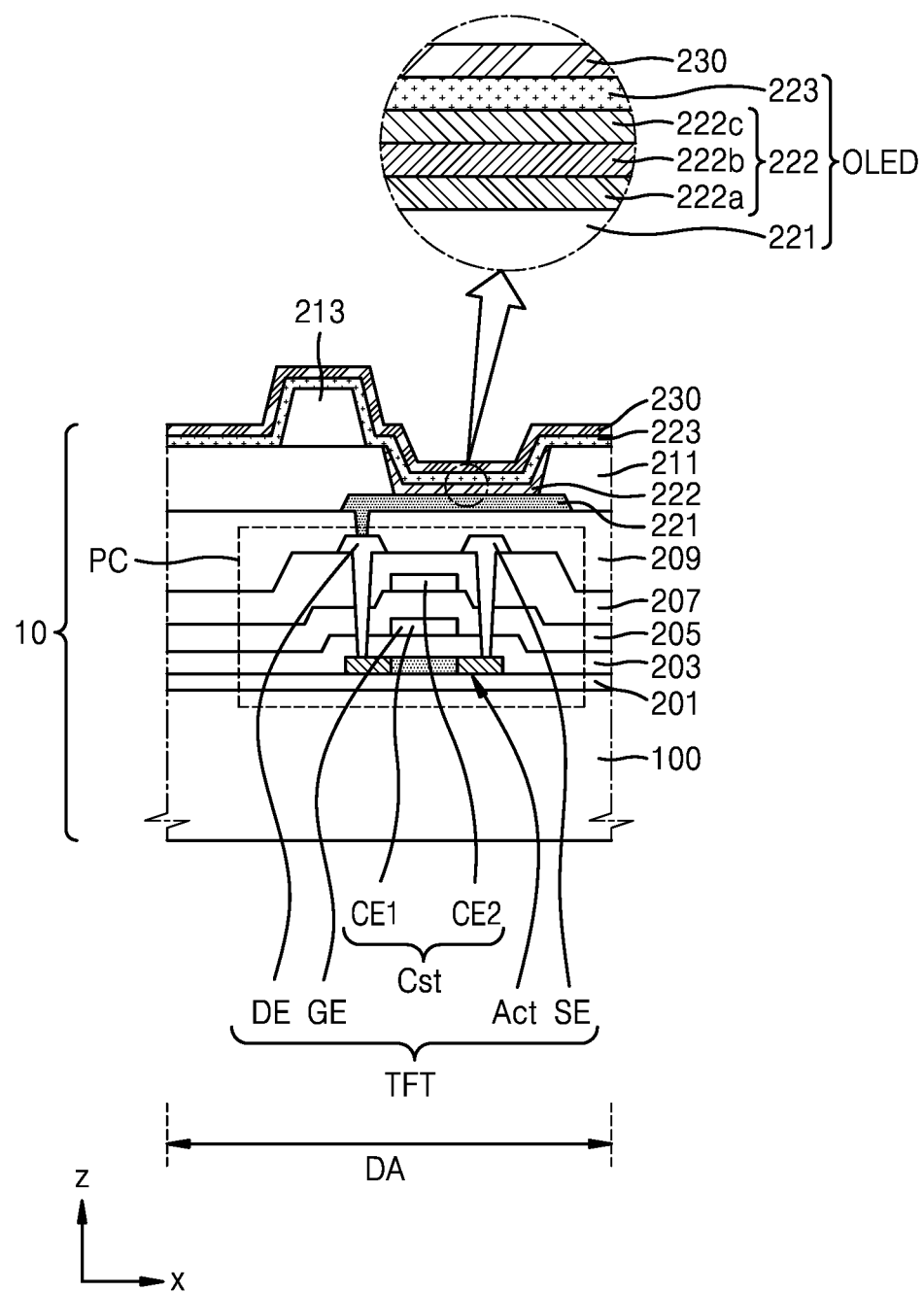
FIG. 9 is a cross-sectional view of a portion of the display panel of FIG. 8 according to an embodiment.
Figure 10A:
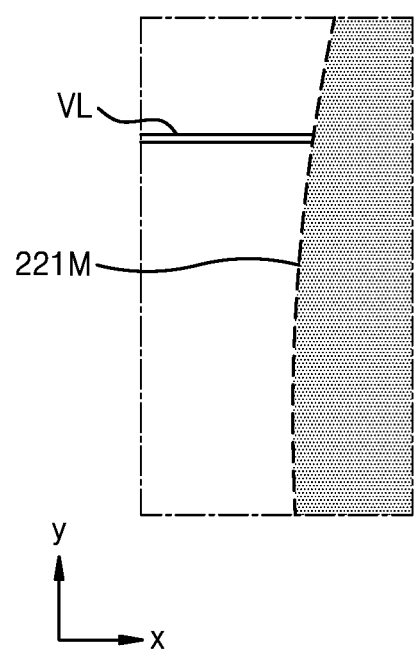
FIG. 10A is a plan view of a region V of FIG. 7 according to an embodiment.
Figure 10B:
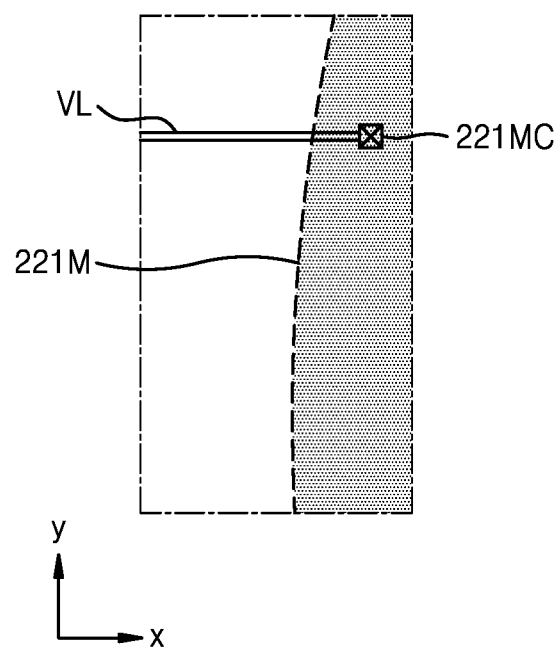
FIG. 10B is a plan view of a region V of FIG. 7 according to an embodiment.

FIG. 7 is a schematic plan view of (a portion of) the display panel 10 according to an embodiment. FIG. 8 is a cross-sectional view taken along lines A-A' and B-B' of FIG. 7 according to an embodiment. FIG. 9 is a cross-sectional view of a portion of the display panel 10 of FIG. 8 according to an embodiment. FIGS. 10A and 10B are plan views of a region V of FIG. 7 according to embodiments.

Referring to FIGS. 7 and 8, the display panel 10 may include a first area OA1 and a second area OA2, a first non-display area NDA1 surrounding the first and second areas OA1 and OA2, and a display area DA surrounding the first non-display area NDA1. The first and second areas OA1 and OA2 may be spaced from each other in an island shape. The first and second areas OA1 and OA2 may have the same shape and the same size as each other. The first and second areas OA1 and OA2 may have different shapes, or the first and second areas OA1 and OA2 may have the same shape and different sizes.

When an edge of each of the first and second areas OA1 and OA2 is referred to as a first line E1, the first non-display area NDA1 may include a first-first non-display area NDA1-1 adjacent to the first line E1 and a first-second non-display area NDA1-2 surrounding the first-first non-display area NDA1-1. A remaining area of the first non-display area NDA1 may be defined as a first-third non-display area NDA1-3. A boundary between the first-first non-display area NDA1-1 and the first-second non-display area NDA1-2 may be referred to as a second line E2, a boundary between the first-second non-display area NDA1-2 and the first-third non-display area NDA1-3 may be referred to as a third line E3, and a boundary between the first-third non-display area NDA1-3 and the display area DA may be referred to as a fourth line E4.

Pixels P may not be arranged in the first non-display area NDA1 and may be arranged in the display area DA. Some pixels P may be spaced from one another by at least the first non-display area NDA1. In a plan view, pixels P may be arranged at opposite sides of the first non-display area NDA1.

Wires (or signal lines) for applying signals and voltages to the pixels P may be arranged in the first-second non-display area NDA1-2, which has a ring shape, having the second line E2 as an interior edge and having the third line E3 as an exterior edge.

Signal lines adjacent to the first area OA1 and the second area OA2 may bypass the first and second areas OA1 and OA2. Some of the data lines DL passing through the display area DA may extend substantially in a y direction to provide data signals to the pixels P arranged above and below the first non-display area NDA1 and may bypass the first lines E1, which are edges of the first area OA1 and the second area OA2, in the first-second non-display area NDA1-2. One or more of the scan lines SL passing through the display area DA may extend substantially in an x direction to provide scan signals to the pixels P arranged at the right side and the left side of the first non-display area NDA1 and may bypass the first lines E1, which are edges of the first area OA1 and the second area OA2, in the first-second non-display area NDA1-2.

After a scan line SL bypasses the edge E1 of the first area OA1, the scan line SL may cross the first-third non-display area NDA1-3 between the first and second areas OA1 and OA2 and then may bypass the edge E1 of the second area OA2. A scan line SL passing through the first-third non-display area NDA1-3 may have at least a portion extending in the x-direction.

One or more data lines DL' may cross the first-third non-display area NDA1-3 and may extend in the y direction in the first-third non-display area NDA1-3 without bypassing the edges of the first and second areas OA1 and OA2. The data lines DL' extending in the y direction without bypassing the edge of the first and second areas OA1 and OA2 may be arranged at or near a central point between the first and second areas OA1 and OA2. In an embodiment, one or more data lines DL' of the data lines DL crossing the first-third non-display area NDA1-3 may bypass one or more edges of the first and second areas OA1 and OA2.

A marginal space necessary for cutting the first and second areas OA1 and OA2 along the first line E1 may be provided in the first-first non-display area NDA1-1, which has a ring shape, having the first and second lines E1 and E2 as the interior and the exterior edges.

Referring to FIG. 8, the display panel 10 may include the first area OA1 (which is an opening area), the display area DA, and the first non-display area NDA1 between the first area OA1 and the display area DA.

The pixel circuit PC on the substrate 100, a pixel electrode 221 connected to the pixel circuit PC, and an intermediate layer 222 and an opposite electrode 223 sequentially arranged on the pixel electrode 221 may be arranged in the display area DA.

According to an embodiment, the substrate 100 may include multiple layers as illustrated in FIG. 8. For example, the substrate 100 may include a first base layer 101, a first barrier layer 102, a second base layer 103, and a second barrier layer 104 that are sequentially stacked.

Each of the first and second base layers 101 and 103 may include a polymer resin. For example, the first and second base layers 101 and 103 may include PES, PAR, PEI, PEN, PET, PPS, polyarylate, PI, PC, cellulose tri-acetate (TAC), CAP, etc. and may be flexible. The polymer resins described above may be transparent.

Each of the first and second barrier layers 102 and 104 may include a barrier layer preventing penetration of external impurities, and may include a single layer or multiple layers including an inorganic material, such as silicon oxide, silicon nitride, and/or silicon oxynitride.

According to an embodiment, the substrate 100 may include a glass material mainly including $SiO_2$, or a resin, such as reinforced plastics, and may be rigid. The substrate 100 may have a stacked structure including a layer including the polymer resins described above, and the barrier layer on the layer including the polymer resins described above. In this case, the substrate 100 may have improved flexibility. The barrier layer may include silicon oxide, silicon nitride, and/or silicon oxynitride.

The pixel circuit PC may be arranged on the substrate 100 and may include a thin film transistor, a storage capacitor, etc. The organic light-emitting diode OLED including the pixel electrode 221, the intermediate layer 222 including an emission layer, and the opposite electrode 223 may emit certain light and may be covered by an encapsulation substrate or a thin film encapsulation layer facing the substrate 100.

Referring to FIG. 9, a display layer 200 (or pixel array layer or display unit 200), which includes a pixel circuit PC and an organic light-emitting diode OLED electrically connected to the pixel circuit PC, may be arranged in the display area DA.

A thin film transistor TFT, a storage capacitor Cst, and a pixel electrode 221 electrically connected to the thin film transistor TFT and the storage capacitor Cst may be formed on the substrate 100. The pixel circuit PC may be arranged on the substrate 100, and the organic light-emitting diode OLED may be located on the pixel circuit PC.

The substrate 100 may include a polymer resin or glass. Descriptions of this aspect correspond to the descriptions given above with reference to FIG. 8.

A buffer layer 201 may be formed on the substrate 100 to prevent impurities from penetrating into a semiconductor layer Act of the thin film transistor TFT. The buffer layer 201 may include an inorganic insulating material, such as silicon oxide, silicon nitride, and silicon oxynitride, and may include a single layer or multiple layers including the inorganic insulating material described above.

The pixel circuit PC may be arranged on the buffer layer 201. The pixel circuit PC may include the thin film transistor TFT and the storage capacitor Cst. The thin film transistor TFT may include the semiconductor layer Act, the gate electrode GE, the source electrode SE, and the drain electrode DE. The thin film transistor TFT illustrated in FIG. 9 may correspond to the driving thin film transistor described with reference to FIG. 5A or the emission control thin film transistor described with reference to FIG. 5B. According to the present embodiment, a top gate-type transistor in which the gate electrode GE is arranged on the semiconductor layer Act with an intervening gate insulating layer 203 is illustrated. According to an embodiment, the thin film transistor TFT may be a bottom gate-type transistor.

The semiconductor layer Act may include polysilicon. Alternatively, the semiconductor layer Act may include amorphous silicon, an oxide semiconductor, an organic semiconductor, or the like. The gate electrode GE may include a low resistive metal material. The gate electrode GE may include a conductive material, such as one of Mo, Al, Cu, T1, etc., and may include a single layer or multiple layers including the above materials.

The gate insulating layer 203 between the semiconductor layer Act and the gate electrode GE may include an inorganic insulating material, such as silicon oxide, silicon nitride, and silicon oxynitride, aluminum oxide, titanium oxide, tantalum oxide, and hafnium oxide. The gate insulating layer 203 may include a single layer or multiple layers including the above materials.

The source electrode SE and the drain electrode DE may include a material having good conductivity. The source electrode SE and the drain electrode DE may include a conductive material, such as Mo, Al, Cu, T1, etc., and may include a single layer or multiple layers including the above materials. According to an embodiment, the source electrode SE and the drain electrode DE may include multiple layers of Ti/Al/Ti.

The storage capacitor Cst may include a lower electrode CE1 and an upper electrode CE2 overlapping each other with a first interlayer insulating layer 205 therebetween. The storage capacitor Cst may overlap the thin film transistor TFT. In relation to this, FIG. 9 illustrates that the gate electrode GE of the thin film transistor TFT is the lower electrode CE1 of the storage capacitor Cst. According to another embodiment, the storage capacitor Cst may not overlap the thin film transistor TFT. The storage capacitor Cst may be covered by a second interlayer insulating layer 207.

The first and second interlayer insulating layers 205 and 207 may include an inorganic insulating material, such as silicon oxide, silicon nitride, and silicon oxynitride, aluminum oxide, titanium oxide, tantalum oxide, hafnium oxide, etc. The first and second interlayer insulating layers 205 and 207 may include a single layer or multiple layers including the above materials.

The pixel circuit PC including the thin film transistor TFT and the storage capacitor Cst may be covered by a planarization insulating layer 209. The planarization insulating layer 209 may include an upper surface having an approximately flat portion. The planarization insulating layer 209 may include an organic insulating material, such as a general purpose polymer, such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. According to an embodiment, the planarization insulating layer 209 may include PI. Alternatively, the planarization insulating layer 209 may include an inorganic insulating material or may include an inorganic insulating material and an organic insulating material.

The pixel electrode 221 may be formed on the planarization insulating layer 209. The pixel electrode 221 may include conductive oxide, such as indium tin oxide (ITO), indium zinc oxide (IZO), zinc oxide (ZnO), indium oxide (In$_2$O$_3$), indium gallium oxide (IGO), or aluminum zinc oxide (AZO). According to an embodiment, the pixel electrode 221 may include a reflective layer including Ag, Mg, Al, Pt, Pd, Au, Ni, Nd, Ir, Cr, or a compound thereof. According to an embodiment, the pixel electrode 221 may further include a layer including ITO, IZO, ZnO or In$_2$O$_3$ above/below the reflective layer described above.

A pixel-defining layer 211 may be formed on the pixel electrode 221. The pixel-defining layer 211 may include an opening exposing an upper surface of the pixel electrode 221 and may cover an edge of the pixel electrode 221. The pixel-defining layer 211 may include an organic insulating material. Alternatively, the pixel-defining layer 211 may include an inorganic insulating material, such as silicon oxide, silicon nitride, and/or silicon oxynitride. Alternatively, the pixel-defining layer 211 may include an organic insulating material and an inorganic insulating material.

The intermediate layer 222 may include an emission layer 222b. The intermediate layer 222 may include a first functional layer 222a below the emission layer 222b and/or a second functional layer 222c above the emission layer 222b. The emission layer 222b may include a high molecular-weight organic material or a low molecular-weight organic material emitting light of a certain color.

The first functional layer 222a may include a single layer or multiple layers. For example, when the first functional layer 222a includes a high molecular-weight material, the first functional layer 222a may include a hole transport layer (HTL) having a single-layered structure including poly-(3, 4)-ethylene-dihydroxy thiophene (PEDOT) or polyaniline (PANI). When the first functional layer 222a includes a low molecular-weight material, the first functional layer 222a may include a hole injection layer (HIL) and an HTL.

The second functional layer 222c may be optional. For example, when the first functional layer 222a and the emission layer 222b include a high molecular-weight material, the second functional layer 222c may be formed. The second functional layer 222c may include a single layer or multiple layers. The second functional layer 222c may include an electron transport layer (ETL) and/or an electron injection layer (EIL).

The first functional layer 222a and/or the second functional layer 222c of the intermediate layer 222 may be commonly formed in all pixels. The emission layer 222b of the intermediate layer 222 may be separately arranged in each pixel in the display area DA. The emission layer 222b may be arranged in an opening of the pixel-defining layer 211.

The opposite electrode 223 may include a conductive material having a low work function. For example, the opposite electrode 223 may include a (semi-) transparent layer including Ag, Mg, Al, Pt, Pd, Au, Ni, Nd, Ir, Cr, Li, Ca, or an alloy thereof. Alternatively, the opposite electrode 223 may further include a layer, such as ITO, IZO, ZnO, or $In_2O_3$, on the (semi-)transparent layer including the materials described above. The opposite electrode 223 may be formed not only in the display area DA but also in the first non-display area NDA1. The intermediate layer 222 and the opposite electrode 223 may be formed by using heat deposition.

A capping layer 230 may be located on the opposite electrode 223. For example, the capping layer 230 may include LiF and may be formed by using heat deposition. Alternatively, the capping layer 230 may include an inorganic insulating material, such as silicon oxide, silicon nitride, and/or silicon oxynitride. The capping layer 230 may be optional.

A spacer 213 may be formed on the pixel-defining layer 211. The spacer 213 may include an organic insulating material, such as PI. Alternatively, the spacer 213 may include an inorganic insulating material, such as silicon oxide, silicon nitride, and silicon oxynitride, or may include an organic insulating material and an inorganic insulating material.

The spacer 213 may include a different material from the pixel-defining layer 211. Alternatively, the spacer 213 may include the same material as the pixel-defining layer 211, and in this case, the pixel-defining layer 211 and the spacer 213 may be formed together by a mask process using a half tone mask, etc. According to an embodiment, the pixel-defining layer 211 and the spacer 213 may include PI.

Referring to FIG. 8 again, the first non-display area NDA1 of the display panel 10 may include the first-first non-display area NDA1-1, the first-second non-display area NDA1-2, and the first-third non-display area NDA1-3 that are adjacent to a first opening 10H in the order described.

The first-second non-display area NDA1-2 may be a bypassing area in which one or more of the data lines DL bypassing the first area OA1 are arranged.

The first-third non-display area NDA1-3 may be an area through which data lines DL' extend in the y direction without bypassing the first area OA1. The first-third display area NDA1-3 may be an area in which wires are substantially linear without bypassing the first area OA1.

Scan lines SL may be alternately arranged in two layers in the first-second non-display area NDA1-2 with an intervening insulating layer, as illustrated in FIG. 8. When the neighboring scan lines SL are arranged above and below each other with the intervening insulating layer (e.g., the first interlayer insulating layer 205), a gap (pitch) between the neighboring scan lines SL may be reduced, and thus, a width of the first non-display area NDA1 may be reduced. Likewise, although not shown, data lines DL may be alternately arranged in two layers in the first-second non-display area NDA1-2 with an intervening insulating layer.

The scan lines SL may be arranged on layers different from the layer of the data lines DL. For example, the scan lines SL may be arranged below the data lines DL. Although FIG. 8 does not illustrate the scan lines SL below the data lines DL in the first-third non-display area NDA1-3, this is because a cutting direction taken along a line A-A' of FIG. 7, and scan lines SL may be arranged below the data lines DL in the first-third non-display area NDA1-3.

As illustrated in FIG. 7, an electrode layer 221M may be arranged in the first-second non-display area NDA1-2 and the first-third non-display area NDA1-3. The electrode layer 221M may cover the bypassing portions of the wires (e.g., the data and scan lines DL and SL) that bypass areas OA1 and OA2 and may partially cover wires (e.g., the data and scan lines DL and SL) that pass through the first-third non-display area NDA1-3 between the area OA1 and OA2. At least one insulating layer (205, 207, and/or 209 of FIG. 8) may be arranged between the electrode layer 221M and the wires (e.g., the data and scan lines DL and SL).

According to an embodiment, an edge of the electrode layer 221M adjacent to the display area DA may correspond to an edge of the combination of the first-second non-display area NDA1-2 and the first-third non-display area NDA1-3, the edge being adjacent to the display area DA. An edge of the electrode layer 221M adjacent to one of the first area OA1 and the second area OA2 may correspond to an edge of the first-second non-display area NDA1-2 adjacent to the one of the first area OA1 and the second area OA2.

According to an embodiment, when the first area OA1 and the second area OA2 are circular holes, the electrode layer 221M may include one or more holes corresponding to the first area OA1 and/or the second area OA2. A second radius R2 of a hole of the electrode layer 221M may be greater than a first radius R1 of the first area OA1 or the second area OA2. The first radius R1 may denote a distance between a center O1 of the first area OA1 or a center O2 of the second area OA2 and the corresponding first line E1, which is the edge of the first area OA1 or the second area OA2. The second radius R2 may be the same as a distance between the center O1 of O2 and the corresponding second line E2.

One or more initialization voltage lines VL extending in the x direction may be connected to the electrode layer 221M. The one or more initialization voltage lines VL may be connected to the first and second initialization driving thin film transistors T4 and T7 described with reference to FIGS. 5B and 6 and may have a constant voltage.

The electrode layer 221M connected to a initialization voltage line VL may have the same voltage level as the initialization voltage line VL, and thus the electrode layer 221M may also have the constant voltage. One or more of the wires (e.g., the data and scan lines DL and SL) may be at least partially covered (or shielded) by the electrode layer 221M Coupling between neighboring wires (e.g., the data and scan lines DL and SL) may be reduced.

According to an embodiment, referring to FIG. 10A, an initialization voltage line VL may be integrally formed with the electrode layer 221M or may be arranged on the same layer as the electrode layer 221M and connected to the electrode layer 221M.

According to an embodiment, the initialization voltage line VL may be arranged on the same layer as one or more wires (e.g., the data and scan lines DL and SL) or may be arranged between some of the wires (e.g., the data and scan lines DL and SL) and the electrode layer 221M. When the initialization voltage line VL is arranged on a different layer from the electrode layer 221M, a contact hole 221MC may be formed on a layer between the initialization voltage line VL and the electrode layer 221M, so that the initialization voltage line VL and the electrode layer 221M may be connected with each other via the contact hole 221MC, as illustrated in FIG. 10B.

The electrode layer 221M may have at least one opening OP between the first area OA1 and the second area OA2.

The opening OP may expose at least a portion of a layer (e.g., 209 of FIG. 9) below the electrode layer 221M, and thus, the electrode layer 221M may not cover portions approximately or directly below the opening OP.

Since the electrode layer 221M includes the opening OP, a process defect, such as a short circuit at an area between the electrode layer 221M and the lower wires (e.g., the data and scan lines DL and SL) overlapping the electrode layer 221M, may be prevented. The opening OP may be provided in the first-third non-display area NDA1-3, which is between the first area OA1 and the second area OA2, for minimizing the overlap between the electrode layer 221M and the underlying wires (e.g., the data and scan lines DL and SL).

The electrode layer 221M may cover the bypassing portions of the wires (e.g., the data and scan lines DL and SL) located in the first-second non-display area NDA1-2, but may not cover at least one or more of the wires (e.g., the data and scan lines DL and SL) in the first-third non-display area NDA1-3, as illustrated in FIG. 7 and FIG. 8.

The opening OP may have one or more of various shapes. One or more widths of the opening OP may be configured according to embodiments.

Referring to FIG. 7, when an edge of the opening OP crossing a data line DL' is referred to as a first edge EG1, widths defined in a first point P1 and a second point P2, which are two different points on the first edge EG1, may be unequal to each other. That is, a first width w1 of the opening OP defined in the first point P1 in a y direction may be unequal to a second width w2 of the opening Op defined in the second point P2 in the y direction.

A first distance d1 between the first point P1 of the first edge EG1 of the opening OP and the fourth line E4 of the first-third non-display area NDA1-3 may be unequal to a second distance d2 between the second point P2 of the first edge EG1 of the opening OP and the fourth line E4 of the first-third non-display area NDA1-3.

The first distance d1 and the second distance d2 may be among the least distances between the edge of the opening OP and the display area DA.

According to an embodiment, the minimum distance between the first edge EG1 of the opening OP and the fourth line E4 of the first-third non-display area NDA1-3 may correspond to a center CE of the opening OP.

According to an embodiment, at least a portion of the first edge EG1 of the opening OP may be curved. The first edge EG1 may be convex toward the display area DA. The first edge EG1 of the opening OP may be a curved line. A second edge EG2 of the opening may extend substantially in the y direction and may be a straight line. As another example, the shape of the opening OP may be substantially a square with curved edges at corners. As another example, the shape of the opening OP may be substantially a circle or an oval.

The opening OP may cross a virtual line L (or geometric line L) connecting a first center O1 of the first area OA1 and a second center O2 of the second area OA2. The opening OP may have a y-direction width greater than an x-direction width. According to an embodiment, as illustrated in FIG. 7, the center CE of the opening OP may be a middle point of the virtual line L, and the maximum y-direction width of the opening Op may be at the center CE.

A length d1 corresponding to an overlap between a first data line DL1 and the electrode layer 221M may be unequal to a length d2 corresponding to an overlap between a second data line DL2 and the electrode layer 221M.

The opening OP may expose most of the area between the first area OA1 and the second area OA2. In some embodiments, the maximum width of the opening OP in the y direction may be greater than a diameter (2*R1) of the first area OA1. In an embodiment, the maximum width of the opening OP in the y direction may be the equal to the hole diameter (2*R2) of the electrode layer 221M.

As illustrated in FIG. 7 and FIG. 8, the electrode layer 221M may include holes 221H spaced from one another. The plurality of holes 221H may be spaced from the opening OP, and a size of each of the holes 221H may be less than a size of the opening OP. For example, a width of each of the holes 221H in the y direction may be less than one tenth of the width of the opening OP in the y direction.

The plurality of holes 221H may be vent holes formed to perform out-gassing of an organic layer below the electrode layer 221M. As illustrated in FIG. 8, the plurality of holes 221H may be spaced from one another, so that out-gassing of the planarization insulating layer 209, which is an organic insulating layer below the electrode layer 221M, may be easily performed.

The out-gassing effect may also be obtained through the opening OP in the electrode layer 221M, and thus, potential pixel shrinkage may be prevented.

As illustrated in FIG. 8, the electrode layer 221M may include the same material as the pixel electrode 221 and may be arranged on the same layer as the pixel electrode 221. An initialization voltage line (VL of FIG. 7) connected to the electrode layer 221M may also include the same material as the pixel electrode 221. An initialization voltage line VL may be arranged on a layer different from the layer of the electrode layer 221M or may include a material different from the material of the electrode layer 221M.

Figure 11:
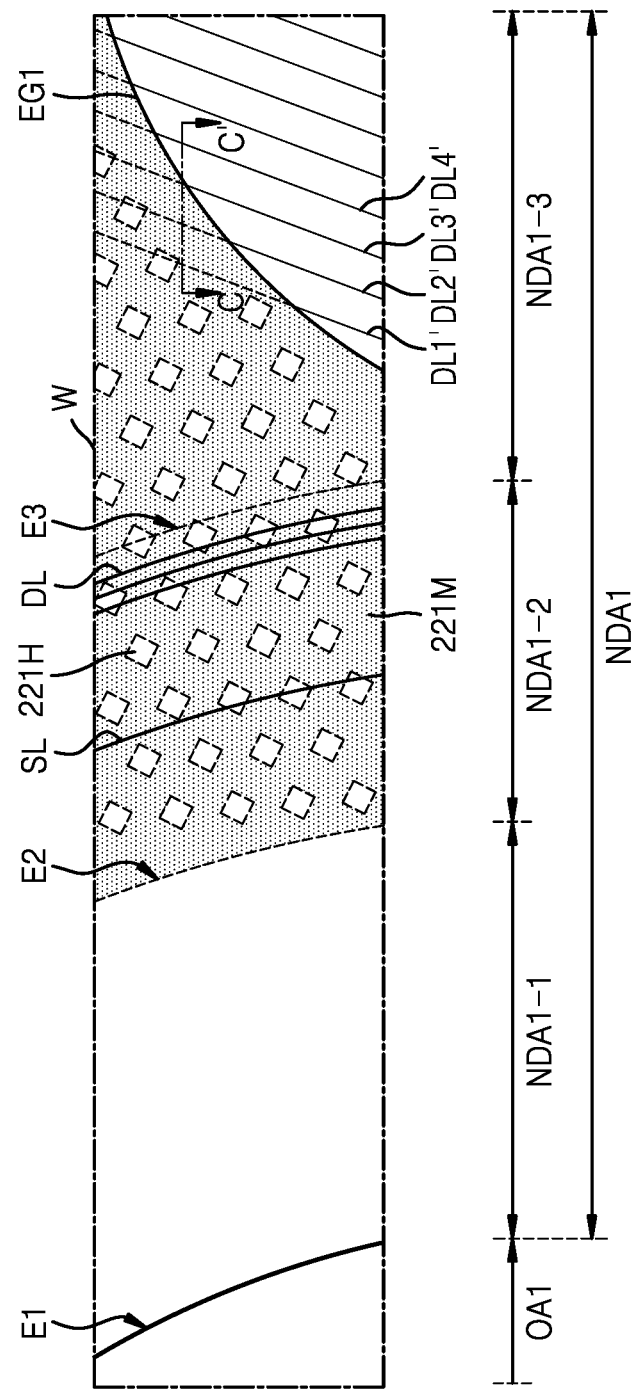
FIG. 11 is a plan view of a region W of FIG. 7 according to an embodiment.
Figure 12:
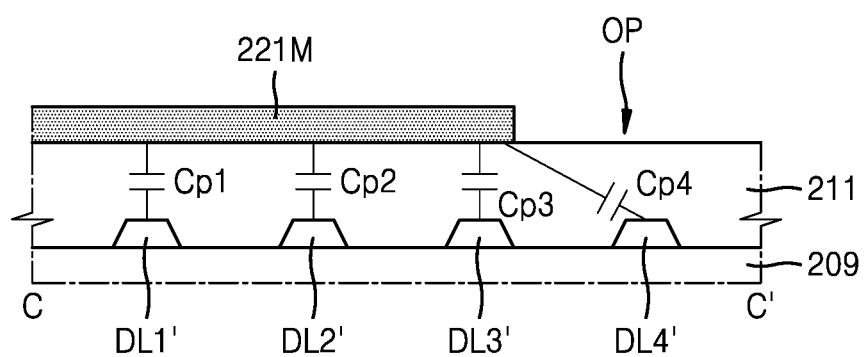
FIG. 12 is a cross-sectional view taken along a line C-C' of FIG. 11 according to an embodiment.

FIG. 11 is a plan view of a region W of FIG. 7, and FIG. 12 is a cross-sectional view taken along a line C-C' of FIG. 11.

Referring to FIG. 11, the first-first non-display area NDA1-1, the first-second non-display area NDA1-2, and the first-third non-display area NDA1-3 away from the first area OA1 in the described order may be arranged. The electrode layer 221M may be arranged in the first-second non-display area NDA1-2 and the first-third non-display area NDA1-3. The first-second non-display area NDA1-2 may be an area in which the bypassing portions of the wires (e.g., the data and scan lines DL and SL) are arranged.

The opening OP of the electrode layer 221M may be located in the first-third non-display area NDA1-3, and the plurality of holes 221H may be spaced from the opening OP.

The holes 221H alternately arranged in rows and/or columns. For example, among the holes 221H, a first hole and a second hole may be arranged in a first row of holes, and a third hole immediately adjacent to both the first and second holes may be arranged in a second row of holes immediately neighboring the first row of holes, wherein the third hole is arranged between the first and second holes.

Some holes 221H may overlap (or partially expose) bypassing portions of wires (e.g., the data and scan lines DL and SL) and may overlap (or partially expose) portions of non-bypassing wires (e.g., DL1'), wherein the non-bypassing wires may intersect the opening OP. The opening OP may not expose bypassing portions of the wires (e.g., the data and scan lines DL and SL). Holes 221H may surround the first and second areas OA1 and OA2.

Referring to FIG. 12, first through fourth parasitic capacitances Cp1, Cp2, Cp3, and Cp4 may occur between the data lines DL1', DL2', DL3', and DL4' and the electrode layer 221M, respectively. That is, as the overlapping area increases, the parasitic capacitances may increase.

Referring to illustrated in FIG. 11, since the first edge EG1 of the opening OP is curved, an overlapping area between the electrode layer 221M and the data lines DL1'; DL2', DL3', and DL4' may gradually vary from the first data line DL1' to the fourth data line DL4'. Thus, the parasitic capacitances may also gradually change from the first data line DL1' to the fourth data line DL4'. The parasitic capacitances may decrease in an order of the first parasitic capacitance Cp1, the second parasitic capacitance Cp2, the third parasitic capacitance Cp3, and the fourth parasitic capacitance Cp4.

As the parasitic capacitances gradually change, wiring load between the neighboring data lines DL1', DL2', DL3', and DL4' may also gradually change to prevent degradation of display quality due to a rapid change in the wiring load.

Figure 13:
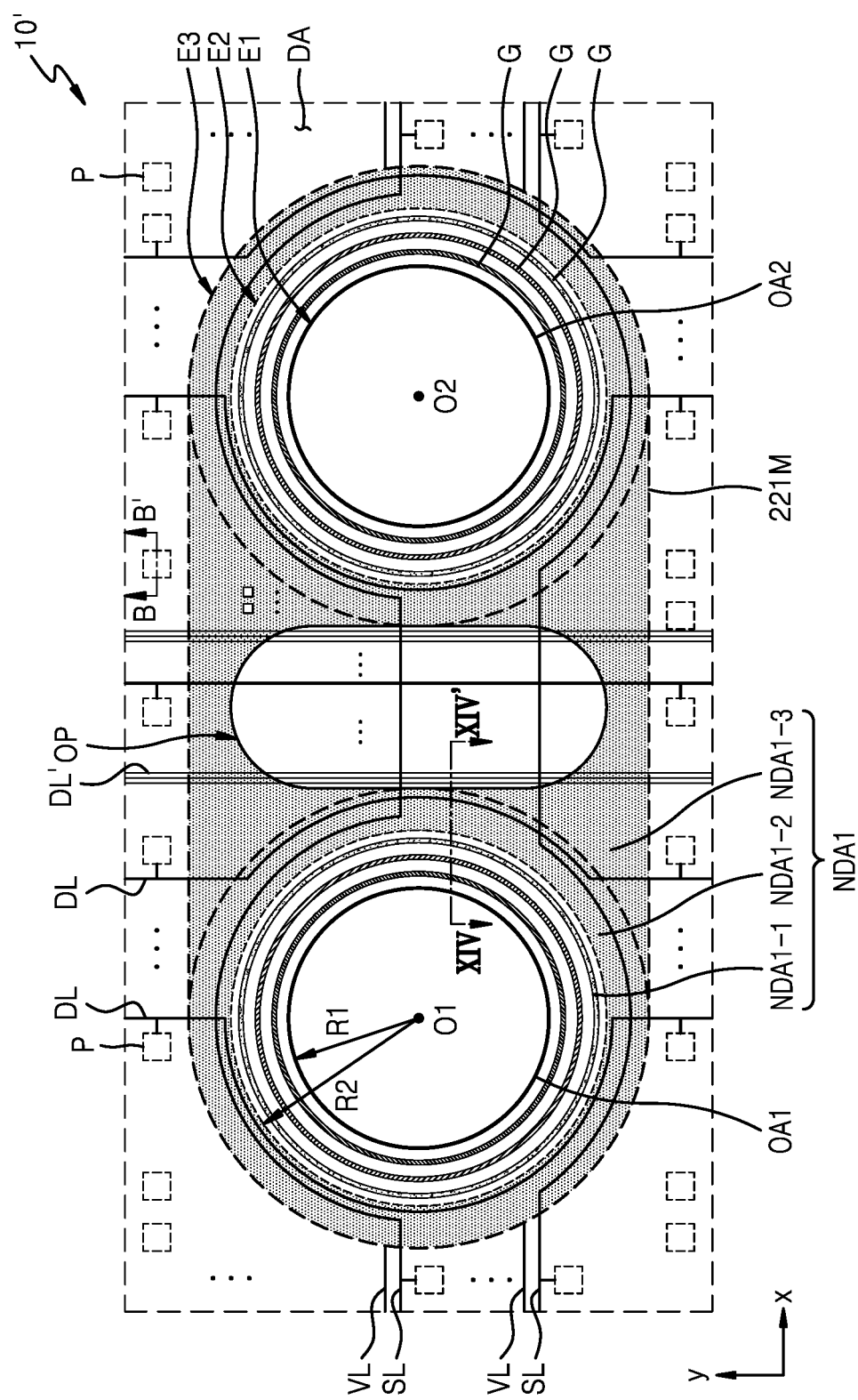
FIG. 13 is a schematic plan view of (a portion of) a display panel according to an embodiment.
Figure 14:
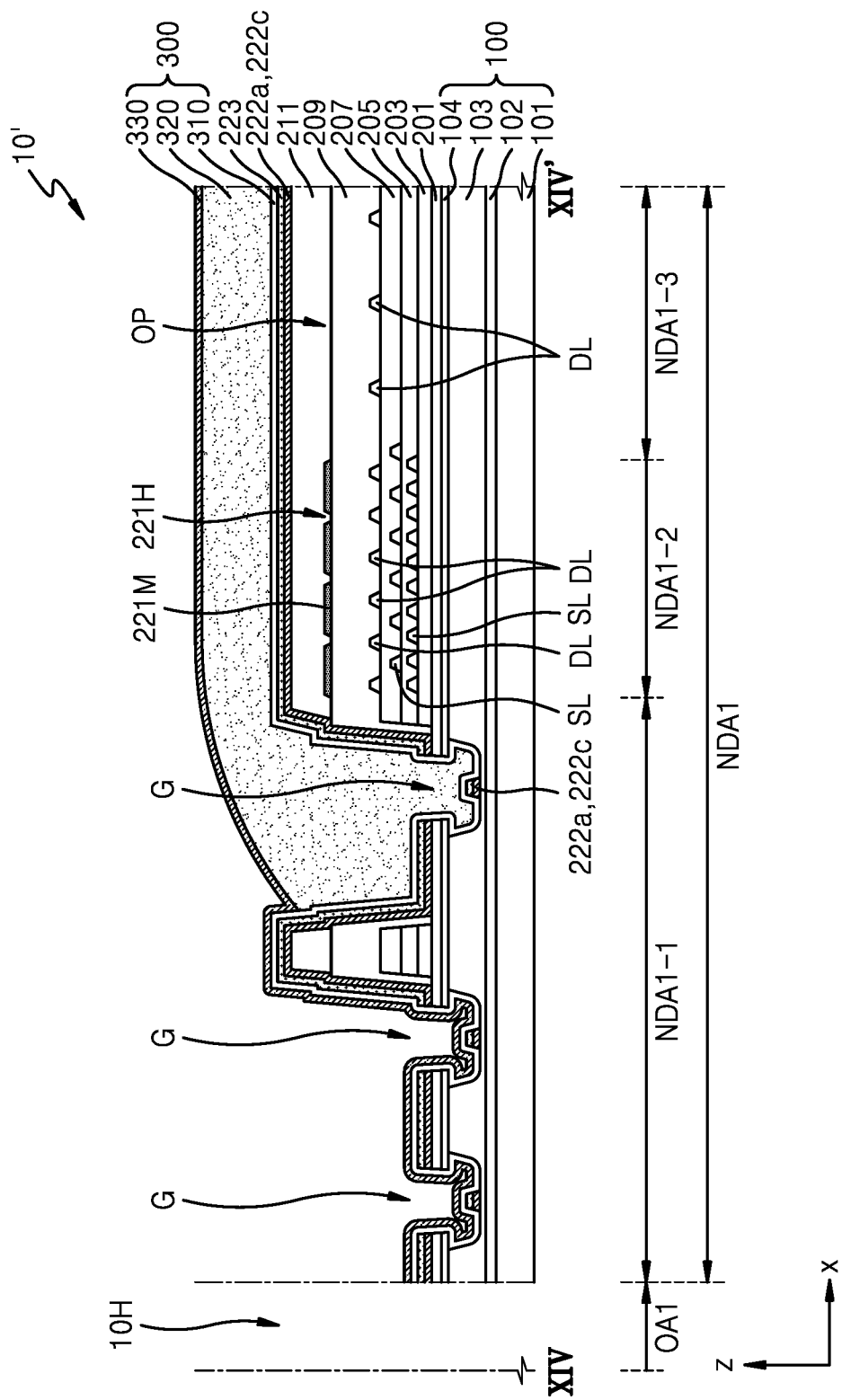
FIG. 14 is a cross-sectional view taken along a line XIV-XIV' of FIG. 13 according to an embodiment.

FIG. 13 is a schematic plan view of (a portion of) a display panel 10' according to an embodiment. FIG. 14 is a cross-sectional view taken along a line XIV-XIV' of FIG. 13.

The embodiment illustrated in FIGS. 13 and 14 has structures that are analogous to or substantially the same as structure discussed with reference to one or more of FIGS. 1 to 12, except that groves G are located in the first-first non-display area NDA1-1.

Referring to FIGS. 13 and 14, the substrate 100 may have a multi-layered structure including a polymer resin layer, thereby giving a flexible characteristic to the display panel 10'. For example, the substrate 100 may include the first base layer 101, the first barrier layer 102, the second base layer 103, and the second barrier layer 104, which are sequentially stacked, wherein the first and second base layers 101 and 103 may include polymer resins and the first and second barrier layers 102 and 104 may include an inorganic material for a barrier. Examples of the polymer resins and the inorganic material are described above with reference to FIG. 8.

The first-first non-display area NDA1-1 may be a groove area in which grooves are arranged. FIGS. 13 and 14 illustrate three grooves G located in the first-first non-display area NDA1-1. The number of grooves G may be configured according to embodiments. The grooves G may be spaced apart from one another.

Each of the grooves G may be formed in a multi-layer structure including a first layer and a second layer including materials different from each other. According to an embodiment, FIG. 14 illustrates that the grooves G are formed in at least a layer of the multi-layer structure provided in the substrate 100.

According to an embodiment, the grooves G may be formed by removing a portion of the second barrier layer 104 and a portion of the second base layer 103. The grooves G may be formed before the intermediate layer 222 is formed.

A portion of the intermediate layer 222, for example, the first functional layer (222a of FIG. 9) and/or the second functional layer (222c of FIG. 9) extending to the non-display area NDA may be separated based on the grooves G and therefore maybe formed beyond the display area DA. Thus, the extending portion of the intermediate layer 222 may provide additional protection against external water, and external water that has penetrated through the first opening 10H may be prevented from proceeding to an organic light-emitting diode of the display DA through an organic encapsulation layer 320.

Since the second functional layer (222c of FIG. 9) can be separated based on the grooves G, the first and second functional layers (222a and 222c of FIG. 9) may exist not only in the display area DA illustrated in FIG. 13, but also in the first non-display area NDA1, unlike the emission layer (222b of FIG. 9), for providing additional protection against intruding water.

As illustrated in FIG. 13, since the grooves G are arranged in the first-first non-display area NDA1-1, the grooves G may be located closer to the first area OA1 and the second area OA2 than one or more bypassing portions of the data lines DL and/or the scan lines SL that bypass the first lines E1, which are edges of the first area OA1 and the second area OA2.

According to an embodiment, the grooves G may have a ring shape substantially surrounding each of the first area OA1 and the second area OA2 in the first-first non-display area NDA1-1 in a plan view.

A radius of each of the grooves G with respect to the center O1 of the first area OA1 may be greater than the first radius R1, which is the radius of the first area OA1, and may be less than the second radius R2, which is the radius of a hole of the electrode layer 221M.

An organic light-emitting diode (the organic light-emitting-diode OLED of FIG. 9) of the display panel 10' may be covered by a thin film encapsulation layer 300. The thin film encapsulation layer 300 may include at least one organic encapsulation layer and at least one inorganic encapsulation layer.

According to an embodiment, FIG. 14 illustrates that the thin film encapsulation layer 300 includes a first inorganic encapsulation layer 310, a second inorganic encapsulation layer 330, and an intervening organic encapsulation layer 320. According to an embodiment, the number of organic encapsulation layers, the number of inorganic encapsulation layers, and an order of stack of the inorganic encapsulation layers and the organic encapsulations may be different.

The first and second inorganic encapsulation layers 310 and 330 may include at least one inorganic insulating material, such as aluminum oxide, titanium oxide, tantalum oxide, hafnium oxide, zinc oxide, silicon oxide, silicon nitride, and silicon oxynitride, and may be formed by chemical vapor deposition (CVD), etc. The organic encapsulation layer 320 may include a polymer-based material. The polymer-based material may include a silicon-based resin, an acryl-based resin, an epoxy-based resin, polyimide, polyethylene, etc.

According to the embodiment illustrated in FIG. 14, the first area OA1 of the display panel 10' may include the first opening 10H and the grooves G. Each groove G may be spaced apart from the first opening 10H and may be concave in a z direction, which is a thickness direction.

Figure 15:
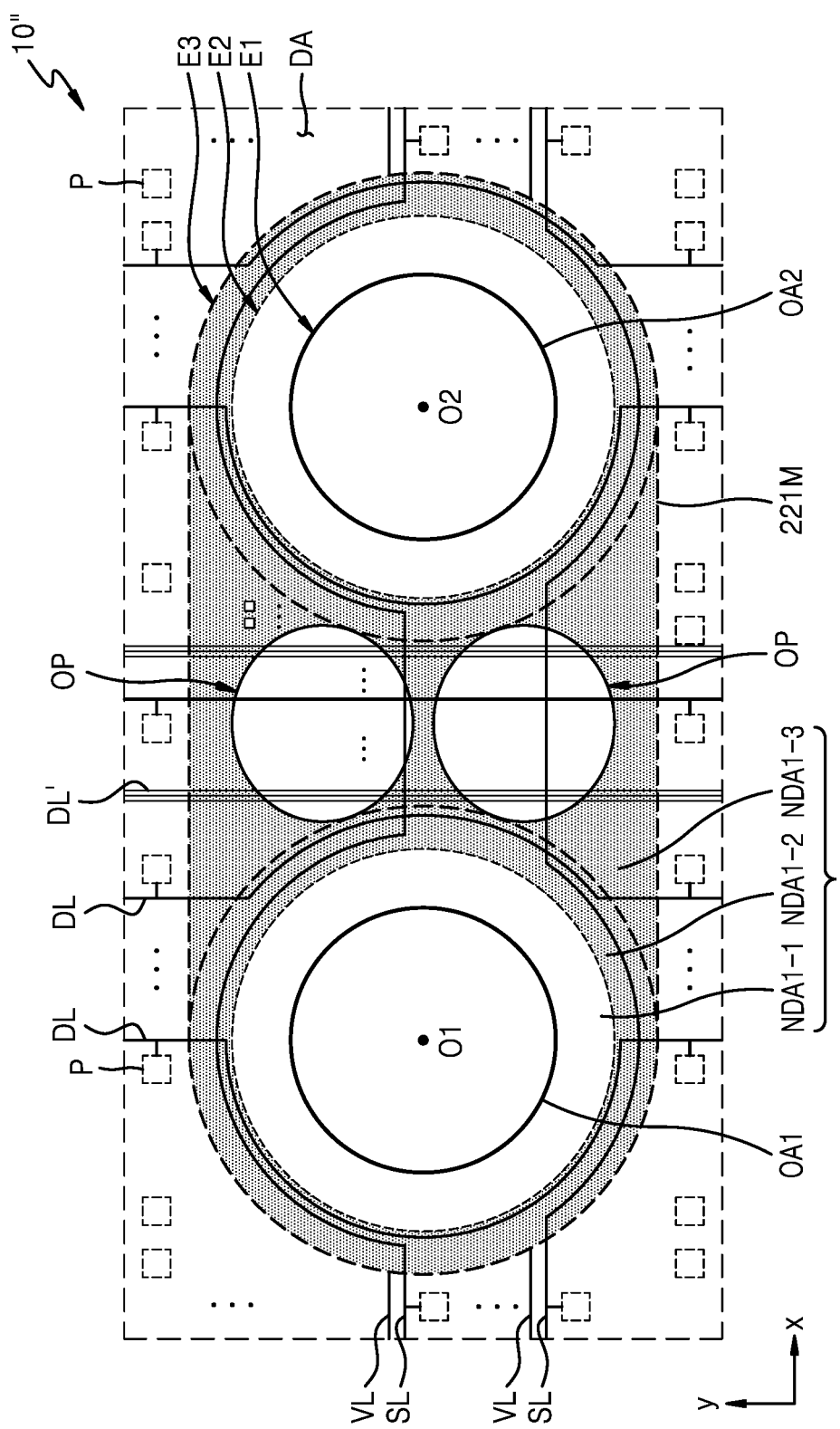
FIG. 15 is a schematic plan view of (a portion of) a display panel according to an embodiment.

FIG. 15 is a schematic plan view of (a portion of) a display panel 10" according to an embodiment.

The embodiment illustrated in FIG. 15 may have structures that are analogous to or substantially the same as structures described with reference to one or more of FIGS. 1 to 14, except structures of openings OP included in the electrode layer 221M.

Referring to FIG. 15, multiple openings OP may be included in the electrode layer 221M. FIG. 15 illustrates that the number of openings OP is two and the two openings OP are arranged in the drawing direction. Three or more openings OP may be provided in the electrode layer 221M and the openings OP may be arranged side by side or in a diagonal direction in a plan view of the display panel 10'''.

The number of openings OP and the location of the openings OP may be adjusted to optimally reduce short defects, shield wires (e.g., the data and scan lines DL and SL), and/or minimize parasitic capacitances.

In an area having relatively high parasitic capacitances between the electrode layer 221M and data lines DL, curved portions of edges of the openings OP may be increased, compared to other areas, in order to smooth changes of the parasitic capacitance between the data lines DL.

FIG. 15 illustrates that the plurality of openings OP have circular (or oval) shapes. The openings OP may have one or more other shapes that include curved edge portions. A least two openings OP may have shapes different from each other.

Figure 16:
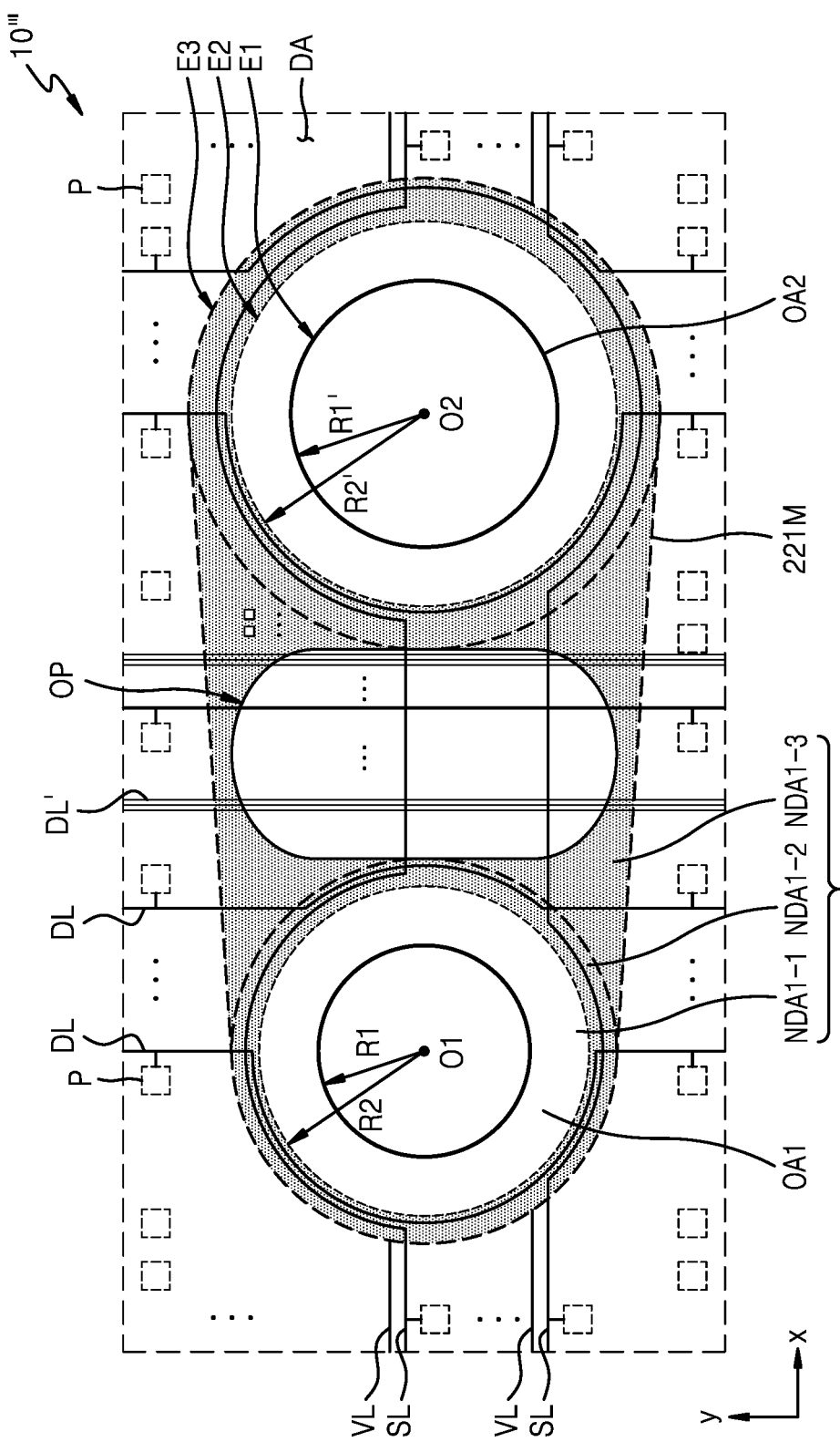
FIG. 16 is a schematic plan view of (a portion of) a display panel, according to an embodiment.

FIG. 16 is a schematic plan view of (a portion of) a display panel 10''' according to an embodiment.

The embodiment illustrated in FIG. 16 may have structures that are analogous to or substantially the same as structures described with reference to one or more of FIGS. 1 to 15, except that the first area OA1 and the second area OA2 have sizes different from each other.

Referring to FIG. 16, a hole radius R1 of the first area OA1 may be unequal to a hole radius R1' of the second area OA2. A size of each of the first area OA1 and the second area OA2 may be adjusted according to a size of a corresponding electronic element, such as a sensor or a camera.

According to an embodiment, when the size of the first area OA1 is less than the size of the second area OA2, a maximum width of the opening OP provided in the electrode layer 221M in a y direction may be equal to a hole diameter 2*R2' of the second area OA2 of the electrode layer 221M. The opening OP may be sufficiently large, such that short-circuit prevention and out-gassing may be optimized.

In an embodiment, the maximum width of the opening OP in the y direction may have a value between the hole diameter 2*R2' of the second area OA2 and the hole diameter 2*R2 corresponding to the first area OA1. When the opening OP has a reduced size due to a design, etc., the maximum width of the opening OP in the y direction may be equal to the hole diameter 2*R2 corresponding to the first area OA1 of the electrode layer 221M.

According to embodiments, the display panels 10, 10', 10'', and 10''' may optimize display quality by optimizing change rates of parasitic capacitances related to wires near an electronic element such as a sensor or a camera.

Embodiments described herein should be considered in an illustrative sense and not for purposes of limitation. Descriptions of features or aspects related to an embodiment may be applicable to other embodiments.

While example embodiments have been described with reference to the figures, various changes in form and details may be made in the example embodiments without departing from the scope defined by the following claims.

What is claimed is:

1. A display panel comprising:
   a first hole;
   a second hole spaced from the first hole;
   a display element;
   a switching element electrically connected to the display element;
   a first wire between the first hole and the second hole in a plan view of the display panel and electrically connected to the switching element; and
   a conductive member having a first opening between the first hole and the second hole in the plan view of the display panel, and partially covering the first wire, wherein a first edge portion of the conductive member intersects the first wire and is positioned between the display element and the first hole in the plan view of the display panel.

2. The display panel of claim 1, wherein the first wire is a data line electrically connected to the switching element for applying a data signal to the display element.

3. The display panel of claim 2, wherein the first opening has a first width in a first direction and has a second width in a second direction, and wherein the first width is unequal to the second width.

4. The display panel of claim 3, wherein the first opening has a first edge crossing the data line and including at least a curved portion.

5. The display panel of claim 1, wherein the conductive member comprises holes spaced from one another, and wherein
   each of the holes is smaller than the first opening in the plan view of the display panel.

6. The display panel of claim 1, wherein the conductive member comprises holes spaced from one another, and wherein at least one of the holes partially exposes the first wire.

7. The display panel of claim 1, further comprising a second wire bypassing an edge of the first hole, wherein the first opening is spaced from the second wire in the plan view of the display panel.

8. The display panel of claim 1, further comprising:
   an initialization voltage line electrically connected to the conductive member and configured to provide a constant voltage to the conductive member.

9. The display panel of claim 1, wherein the conductive member has a constant voltage.

10. The display panel of claim 1, wherein the display element comprises a pixel electrode, an opposite electrode, and an emission layer between the pixel electrode and the opposite electrode.

11. The display panel of claim 10, wherein a material of the conductive member is identical to a material of the pixel electrode.

12. The display panel of claim 1, wherein the conductive member comprises a third hole and a fourth hole respectively corresponding to the first hole and the second hole.

13. A display panel comprising:
   a substrate comprising a first area and a second area, a non-display area surrounding the first and second areas, and a display area surrounding the non-display area;
   a plurality of display elements arranged in the display area and each comprising a pixel electrode, an opposite electrode, and an emission layer between the pixel electrode and the opposite electrode;
   a plurality of wires bypassing at least a portion of an edge of each of the first and second areas in the non-display area; and
   an electrode layer covering at least one of the plurality of wires in the non-display area and having an opening that is positioned between the first area and the second area.

14. The display panel of claim 13, wherein the plurality of wires comprise a plurality of data lines applying a data signal to a plurality of pixel circuits that are electrically respectively coupled to the plurality of display elements, the plurality of data lines comprise a first data line and a second data line to correspond to the at least one opening, and a size of an area of the first data line overlapping the electrode layer is different from a size of an area of the second data line overlapping the electrode layer.

15. The display panel of claim 13, wherein the electrode layer comprises a plurality of holes apart from one another, and at least one of the plurality of holes arranged to surround the first and second areas.

16. The display panel of claim 13, wherein the plurality of wires comprise a plurality of data lines applying a data signal to a plurality of pixel circuits that are electrically respectively coupled to the plurality of display elements, and a plurality of initialization voltage lines electrically connected to the electrode layer.

17. The display panel of claim 16, wherein the plurality of initialization voltage lines have a constant voltage, and the electrode layer has a same level of voltage as the plurality of initialization voltage lines.

18. The display panel of claim 13, wherein the electrode layer comprises a same material as the pixel electrode.

19. The display panel of claim 13, further comprising an organic insulating layer below the electrode layer, wherein the electrode layer exposes at least a portion of the organic insulating layer through the at least one opening.

20. The display panel of claim 13, further comprising:

at least one groove provided in the non-display area and more adjacent to the first and second areas than the plurality of wires; and an encapsulation layer covering the plurality of display elements and comprising an inorganic encapsulation layer and an organic encapsulation layer.

* * * * *